US012757587B2

(12) United States Patent
Choi

(10) Patent No.: US 12,757,587 B2
(45) Date of Patent: Oct. 6, 2026

(54) DISPLAY DEVICE AND METHOD OF MANUFACTURING SAME

(71) Applicant: Samsung Display Co., LTD., Yongin-si (KR)

(72) Inventor: Jonghyun Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 424 days.

(21) Appl. No.: 18/235,923

(22) Filed: Aug. 21, 2023

(65) Prior Publication Data

US 2024/0188346 A1 Jun. 6, 2024

(30) Foreign Application Priority Data

Dec. 2, 2022 (KR) ........................ 10-2022-0166761

(51) Int. Cl.
*H10K 59/124* (2023.01)
*H10K 59/12* (2023.01)
*H10K 59/121* (2023.01)
*H10K 71/20* (2023.01)
*H10K 102/00* (2023.01)

(52) U.S. Cl.
CPC ....... *H10K 59/124* (2023.02); *H10K 59/1201* (2023.02); *H10K 59/1213* (2023.02); *H10K 71/233* (2023.02); *H10K 2102/311* (2023.02)

(58) Field of Classification Search
CPC .. H10K 2102/311; H10K 50/00; H10K 59/00; H10K 59/1201; H10K 59/1213; H10K 59/124; H10K 71/233
See application file for complete search history.

(56) References Cited

U.S. PATENT DOCUMENTS

| | | | | |
|---|---|---|---|---|
| 2019/0164998 | A1* | 5/2019 | Cho | H10D 86/423 |
| 2019/0278145 | A1 | 9/2019 | Tanaka et al. | |
| 2021/0359266 | A1* | 11/2021 | Bang | H10K 59/121 |
| 2022/0181400 | A1* | 6/2022 | Choi | H10K 50/86 |
| 2022/0271256 | A1* | 8/2022 | Han | H10K 59/121 |

* cited by examiner

*Primary Examiner* — Shaun M Campbell
(74) *Attorney, Agent, or Firm* — CANTOR COLBURN LLP

(57) ABSTRACT

A display device including a display panel including a display area including a first area and a second area having a higher transmittance than a transmittance of the first area and a non-display area including a third area bendable and adjacent to the display area. The display panel includes a base layer overlapping the display area and the non-display area, a pixel disposed on the base layer in the display area, an inorganic layer overlapping the display area and the non-display area, insulating layers arranged on the inorganic layer, and an insulating pattern overlapping the second area and disposed between the insulating layers, a first groove is defined in the insulating layers, the insulating pattern and a portion of the inorganic layer in the second area, and a second groove is defined in the insulating layers and the third area of the inorganic layer in the third area.

13 Claims, 27 Drawing Sheets

DISPLAY DEVICE AND METHOD OF MANUFACTURING SAME

This application claims priority to Korean Patent Application No. 10-2022-0166761, filed on Dec. 2, 2022, and all the benefits accruing therefrom under 35 U.S.C. § 119, the content of which in its entirety is herein incorporated by reference.

BACKGROUND

1. Field

The present disclosure relates to a display device and a method of manufacturing the display device, and more particularly, to a display device including a plurality of grooves.

2. Description of the Related Art

An electronic device may include various electronic components such as a display panel and an electronic module. The electronic module may include a camera, an infrared sensor, a proximity sensor or the like. The electronic module may be disposed below the display panel. Transmittance of a partial area of the display panel overlapping the electronic module may be higher than transmittance of the other partial area of the display panel. The electronic module may receive an optical signal or output the optical signal through the area having higher transmittance.

SUMMARY

Embodiments of the present disclosure provide a display device including a plurality of grooves for improving transmittance and folding.

Embodiments of the present disclosure also provide a method of manufacturing a display device having a simple manufacturing process.

According to an embodiment, a display device includes a display panel including a display area including a first area and a second area having a higher transmittance than a transmittance of the first area, and a non-display area including a third area which is bendable and adjacent to the display area. In such an embodiment, the display panel includes a base layer overlapping the display area and the non-display area, a pixel disposed on the base layer, an inorganic layer overlapping the display area and the non-display area, a plurality of insulating layers arranged on the inorganic layer, and an insulating pattern overlapping the second area and disposed between the plurality of insulating layers, a first groove is defined in the plurality of insulating layers, the insulating pattern, and a portion of the inorganic layer in the second area, and a second groove is defined in the plurality of insulating layers and the third area of the inorganic layer in the third area.

In an embodiment, the first groove may expose the inorganic layer.

In an embodiment, the second groove may expose an upper surface of the base layer.

In an embodiment, the plurality of insulating layers may entirely overlap the second area, and the insulating pattern may overlap only a portion of the second area.

In an embodiment, the insulating pattern may surround the first groove in a plan view.

In an embodiment, the second area may include a transmissive area corresponding to the first groove, and a light emission area adjacent to the transmissive area.

In an embodiment, the pixel may include a light emission element disposed in the first area and the light emission area of the second area, and a transistor disposed in the first area.

In an embodiment, the light emission element disposed in the light emission area may be electrically connected to the transistor disposed in the first area.

In an embodiment, the display device may further include a groove organic pattern disposed to cover an inner surface of a portion of the plurality of insulating layers defining an upper portion of the first groove and to cover an inner surface of the insulating pattern defining the upper portion of the first groove.

In an embodiment, the display device may further include a groove organic pattern disposed to cover an inner surface of each of the plurality of insulating layers, the insulating pattern, the portion of the inorganic layer defining the first groove.

In an embodiment, the transistor may include a first transistor and a second transistor, the first transistor may include a first semiconductor pattern including a first drain area, a first active area, and a first source area, and a first gate overlapping the first active area, and the second transistor may include a second semiconductor pattern including a second drain area, a second active area, and a second source area, a second gate overlapping the second active area, and a gate insulating pattern disposed between the second active area and the second gate.

In an embodiment, the gate insulating pattern may include a same material as a material of the insulating pattern.

According to an embodiment, a method of manufacturing a display device including a display area including a first area and a second area having a higher transmittance than a transmittance of the first area, and a non-display area including a third area bendable and adjacent to the display area, includes forming an inorganic layer on a base layer overlapping the display area and the non-display area, forming a plurality of insulating layers on the inorganic layer, an insulating pattern disposed between the plurality of insulating layers and overlapping the second area, and a first transistor and a second transistor overlapping the first area, performing a first etching operation to form a first through-hole exposing the first transistor, a first first groove defined by the insulating pattern and a portion of the plurality of insulating layers overlapping the second area, and a first second groove defined by the plurality of insulating layers overlapping the third area, and performing a second etching operation to form a second through-hole exposing the second transistor, a second first groove defined by a portion of the inorganic layer and a remaining portion of the plurality of insulating layers overlapping the second area, and a second second groove defined by the inorganic layer overlapping the third area.

In an embodiment, The second first groove may extend from the first first groove and expose the inorganic layer, and the second second groove may extend from the first second groove and expose an upper surface of the base layer.

In an embodiment, the forming the plurality of insulating layers, the insulating pattern, and the first transistor and the second transistor may include forming the first transistor and a plurality of lower insulating layers covering the first transistor on the inorganic layer, forming a preliminary semiconductor pattern of the second transistor not overlapping the first transistor on the lower insulating layers, forming a preliminary gate insulating pattern layer of the second transistor overlapping the first area and the second area and a preliminary gate layer of the second transistor on the preliminary semiconductor pattern, forming a photo-resist layer overlapping the first area and the second area on the preliminary gate layer, and exposing the photo-resist layer to light using a mask including a transmissive area, a non-transmissive area, and a semi-transmissive area, and the semi-transmissive area may partially overlap the second area.

In an embodiment, the forming the plurality of insulating layers, the insulating pattern, and the first transistor and the second transistor may further include performing a third etching operation to form a first photo-resist layer overlapping the transmissive area or the non-transmissive area and a second photo-resist layer corresponding to the semi-transmissive area, and a thickness of the first photo-resist layer may be greater than a thickness of the second photo-resist layer.

In an embodiment, the forming the plurality of insulating layers, the insulating pattern, and the first transistor and the second transistor may further include performing a fourth etching operation to remove the preliminary gate layer and the preliminary gate insulating pattern layer not overlapping the first photo-resist layer and the second photo-resist layer.

In an embodiment, the forming the plurality of insulating layers, the insulating pattern, and the first transistor and the second transistor may further include removing a portion of the first photo-resist layer and the second photo-resist layer, removing the preliminary gate layer not overlapping a remaining portion of the first photo-resist layer, and an operation of removing the remaining portion of the first photo-resist layer.

In an embodiment, the method of manufacturing the display device may further include forming a groove organic pattern to cover inner surfaces of each of the insulating pattern and the portion of the plurality of insulating layers defining the first first groove, after the performing the first etching operation.

In an embodiment, the method of manufacturing the display device may further include forming a groove organic pattern to cover inner surfaces of a portion of the inorganic layer defining the first first groove and the second first groove, inner surfaces of the plurality of insulating layers, and inner surface of the insulating pattern, after the performing the second etching operation.

BRIEF DESCRIPTION OF THE DRAWINGS

The above and other features of the present disclosure will become apparent by describing in detail embodiments thereof with reference to the accompanying drawings.

DETAILED DESCRIPTION

Figure 1:
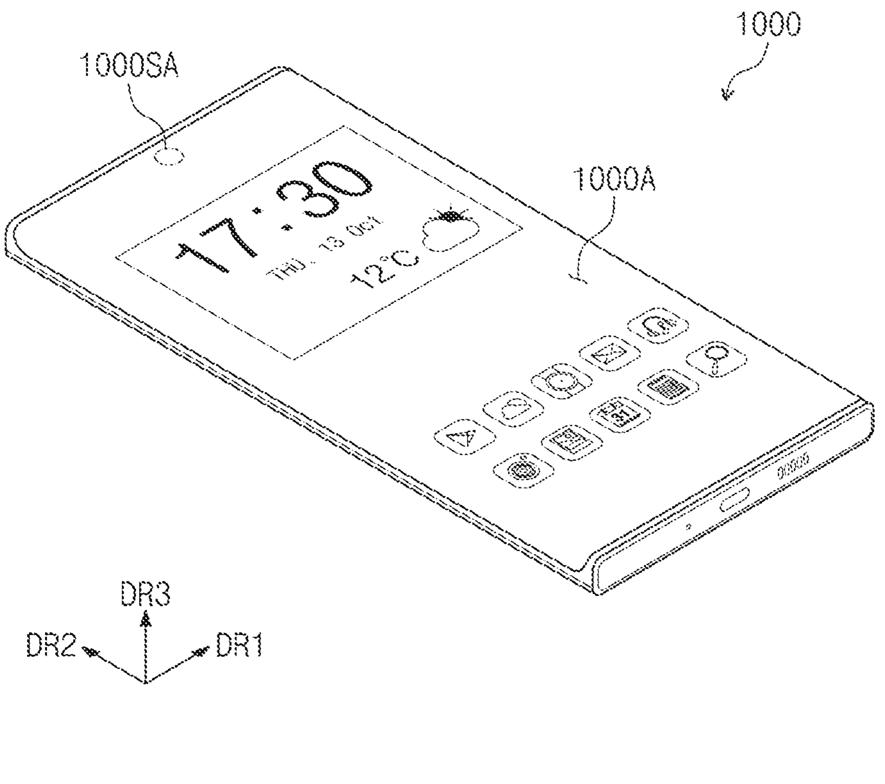
FIG. 1 is a perspective view of an electronic device according to an embodiment of the present disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In the present specification, the expression that a first component (or area, layer, part, portion, etc.) is "on", "connected with", or "coupled to" a second component means that the first component is directly on, connected with, or coupled to the second component or means that a third component is interposed therebetween.

The same reference numerals refer to the same components. Further, in the drawings, the thickness, the ratio, and the dimension of components are exaggerated for effective description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Although the terms "first", "second", etc. may be used to describe various components, the components should not be limited by the terms. The terms are only used to distinguish one component from another component. For example, without departing from the right scope of the present disclosure, a first component may be referred to as a second component, and similarly, the second component may be also referred to as the first component.

Also, the terms "under", "below", "on", "above", etc. are used to describe the correlation of components illustrated in drawings. The terms that are relative in concept are described based on a direction illustrated in drawings.

It will be understood that the terms "include", "comprise", "have", etc. specify the presence of features, numbers, steps, operations, elements, or components, described in the specification, or a combination thereof, and do not exclude in advance the presence or additional possibility of one or more other features, numbers, steps, operations, elements, or components or a combination thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical terms and scientific terms) used in the present specification have the same meaning as commonly understood by those skilled in the art to which the present disclosure belongs. Furthermore, terms such as terms defined in the dictionaries commonly used should be interpreted as having a meaning consistent with the meaning in the context of the related technology, and should not be interpreted in overly ideal or overly formal meanings unless explicitly defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described with reference to the accompanying drawings.

FIG. 1 is a perspective view of an electronic device 1000 according to an embodiment of the present disclosure.

Referring to FIG. 1, in an embodiment, the electronic device 1000 may be a mobile phone. However, the present disclosure is not limited thereto, and the electronic device 1000 may be another electronic device such as a tablet personal computer (PC), a monitor, a television, a vehicle navigation system, a game console, or a wearable device.

The electronic device 1000 may display an image through a display area 1000A. The display area 1000A may be on a plane defined by a first direction DR1 and a second direction DR2. The display area 1000A may further include curved surfaces that are bent from at least two sides of the plane. However, the shape of the display area 1000A is not limited thereto. In an embodiment, for example, the display area 1000A may include only the plane or the display area 1000A may include four curved surfaces bent from at least two sides, for example, four sides, of the plane.

A partial area of the display area 1000A may be defined as a sensing area 1000SA. An embodiment where a single sensing area 1000SA is defined is illustratively illustrated in FIG. 1, but the number of sensing areas 1000SA is not limited thereto. The sensing area 1000SA may be a portion of the display area 1000A but may have higher optical signal transmittance than those of other areas of the display area 1000A. Thus, an image may be displayed through the sensing area 1000SA, and an optical signal may be provided through the sensing area 1000SA.

The electronic device 1000 may include an electronic module disposed in an area overlapping the sensing area 1000SA. The electronic module may receive the optical signal provided from the outside through the sensing area 1000SA or output the optical signal through the sensing area 1000SA. In an embodiment, for example, the electronic module may be a camera module, a sensor, such as a proximity sensor, which measures a distance between an object and a mobile phone, a sensor that recognizes a portion of a body (for example, a fingerprint, an iris, or a face) of a user, or a small lamp that outputs a light, but the present disclosure is not particularly limited thereto.

A thickness direction of the electronic device 1000 may be a third direction DR3 that is a normal direction of the display area 1000A on the plane defined by the first direction DR1 and the second direction DR2. Front surfaces (or upper surfaces) and rear surfaces (or lower surfaces) of members constituting the electronic device 1000 may be defined on the basis of the third direction DR3.

Figure 2:
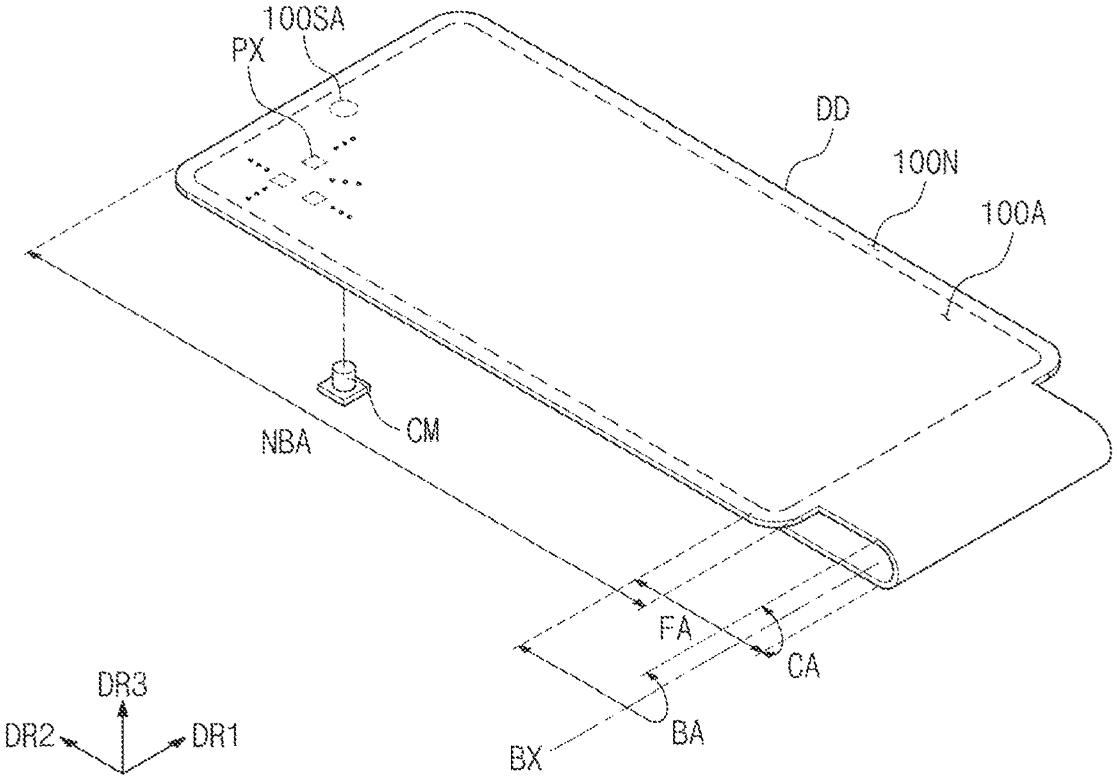
FIG. 2 is an exploded perspective view illustrating some components of the electronic device according to an embodiment of the present disclosure.

FIG. 2 is an exploded perspective view illustrating some components of the electronic device 1000 (see FIG. 1) according to an embodiment of the present disclosure.

Referring to FIG. 2, the electronic device 1000 (see FIG. 1) may include a display device DD and a camera module CM. The display device DD may generate an image and detect an external input. The camera module CM is disposed below the display device DD. When the display device DD is defined as a first electronic module constituting the electronic device 1000, the camera module CM may be defined as a second electronic module.

The display device DD may include a display area 100A and a non-display area 100N. The display area 100A may correspond to the display area 1000A illustrated in FIG. 1. A partial area of the display device DD may be defined as a sensing area 100SA, and the sensing area 100SA may have higher transmittance than those of other areas (hereinafter, a main display area) of the display area 100A. Thus, the sensing area 100SA may provide external natural light to the camera module CM. The sensing area 100SA may correspond to the sensing area 1000SA illustrated in FIG. 1. The sensing area 100SA is a portion of the display area 100A and thus may display an image.

A plurality of pixels PX are arranged in the display area 100A. A light emitting element is disposed in the display area 100A, and the light emitting element is not disposed in the non-display area 100N. The pixels PX are arranged in the sensing area 100SA and the main display area. However, configurations of the pixels PX arranged in the sensing area 100SA and the main display area may be different from each other. A detailed description thereof will be made below.

In an embodiment, the display device DD may be bent, and when the display device DD is in a bent state, the display device DD may include a non-bending area NBA and a bending area BA (or a third area). The bending area BA may include a curvature area CA having a predetermined curvature in the bent state and a facing area FA facing the non-bending area NBA in a bent state.

Figure 3:
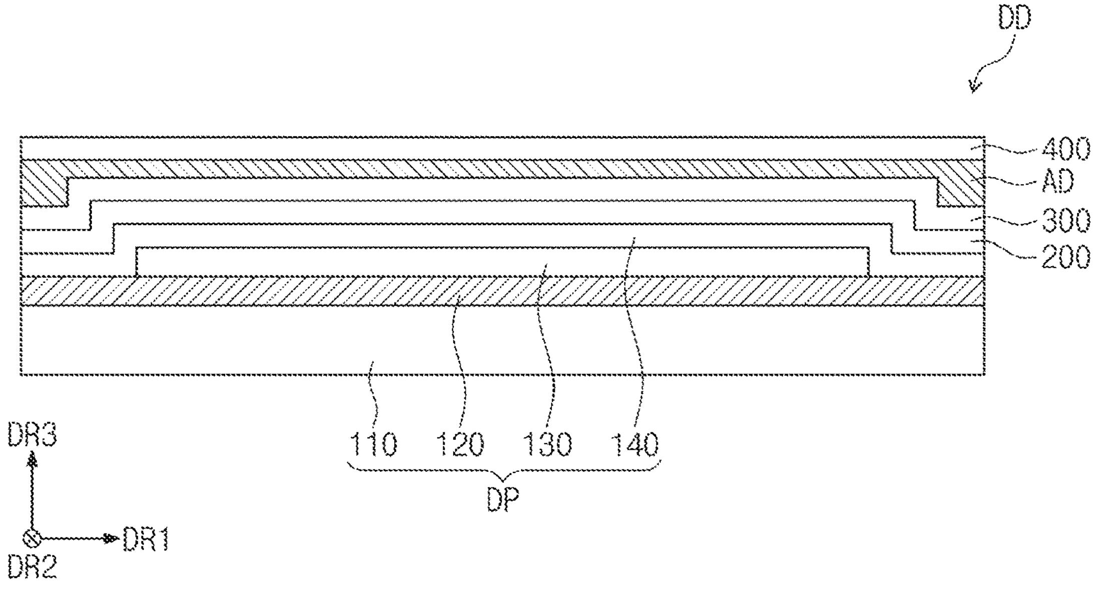
FIG. 3 is a cross-sectional view of a display device according to an embodiment of the present disclosure.

FIG. 3 is a cross-sectional view of the display device DD according to an embodiment of the present disclosure.

Referring to FIG. 3, an embodiment of the display device DD may include a display panel DP, a sensor layer 200, an anti-reflection layer 300, and a window 400. The anti-reflection layer 300 and the window 400 may be coupled to each other using an adhesive layer AD.

The display panel DP may be configured to substantially generate an image. The display panel DP may be a light emitting display panel, and for example, the display panel DP may be an organic light emitting display panel, an inorganic light emitting display panel, a micro light emitting diode (LED) display panel, or a nano LED display panel. The display panel DP may be referred to as a display layer.

The display panel DP may include a base layer 110, a circuit layer 120, a light emitting element layer 130, and an encapsulation layer 140.

Figure 5:
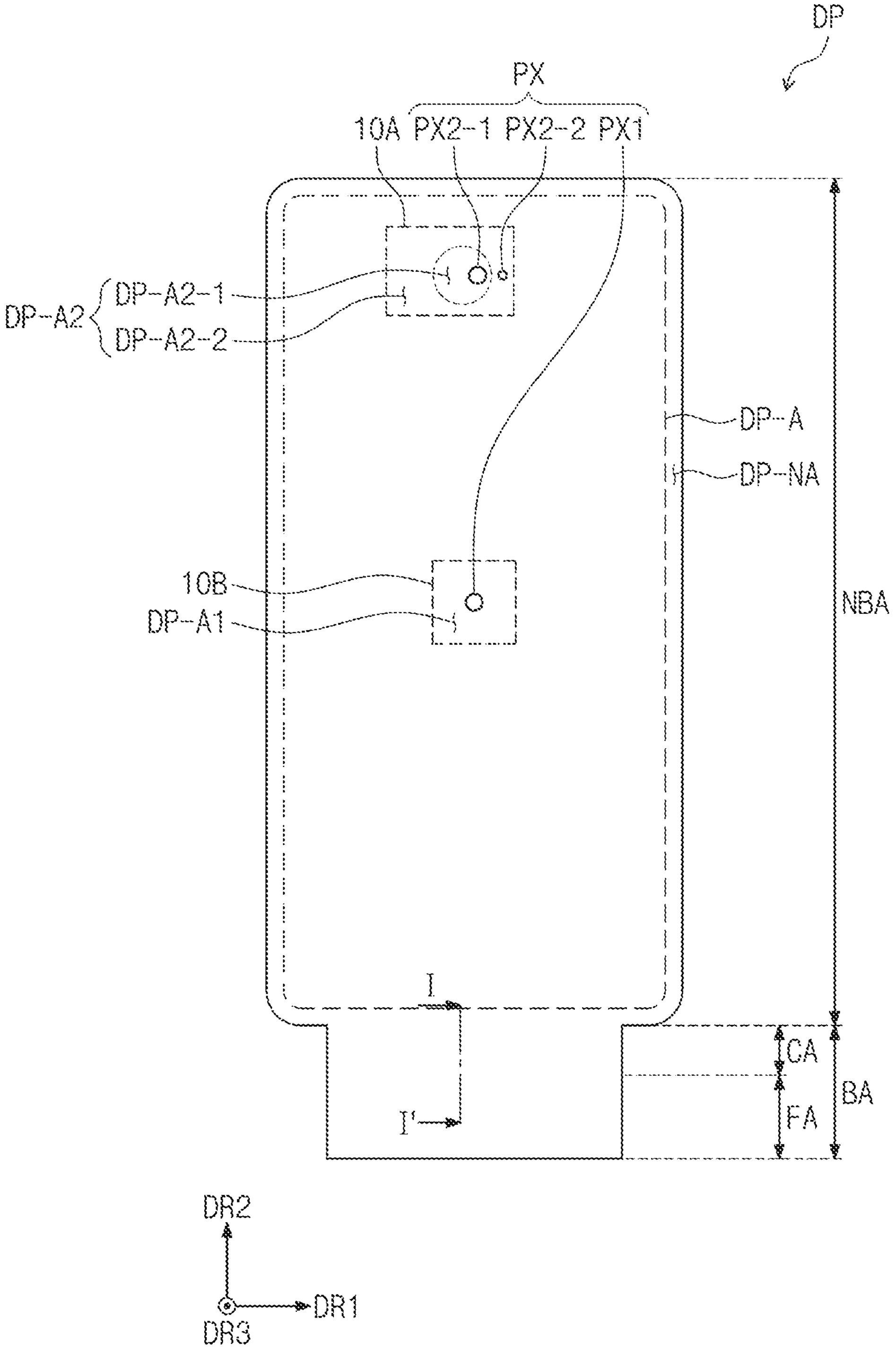
FIG. 5 is a plan view of the display device according to an embodiment of the present disclosure.

The base layer 110 may overlap a display area DP-A and a non-display area DP-NA of FIG. 5. The base layer 110 may be a member that provides a base surface on which the circuit layer 120 is disposed. The base layer 110 may be a rigid substrate or a flexible substrate that may be bent, folded, and rolled (or bendable, foldable or rollable). The base layer 110 may be a glass substrate, a metal substrate, a polymer substrate, or the like. However, an embodiment of the present disclosure is not limited thereto, and the base layer 110 may be an inorganic layer, an organic layer, or a composite material layer.

The base layer 110 may have a multilayer structure. In an embodiment, for example, the base layer 110 may include a first synthetic resin layer, a multi-layer or single-layer inorganic layer, and a second synthetic resin layer disposed on the multi-layer or single-layer inorganic layer. Each of the first and second synthetic resin layers may include a polyimide-based resin, but the present disclosure is not particularly limited thereto.

The circuit layer 120 may be disposed on the base layer 110. The circuit layer 120 may include an insulation layer, a semiconductor pattern, a conductive pattern, a signal line, and the like.

The light emitting element layer 130 may be disposed on the circuit layer 120. The light emitting element layer 130 may include a light emitting element. In an embodiment, for example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign substances such as moisture, oxygen, and dust particles. The encapsulation layer 140 may include at least one inorganic layer. The encapsulation layer 140 may include a laminated structure of an inorganic layer/organic layer/inorganic layer.

The sensor layer 200 may be disposed on the display panel DP. The sensor layer 200 may detect an external input applied from an external unit. The external input may be input of the user. The input of the user may include various types of external inputs such as a portion of the body of the user, light, heat, a pen, and pressure.

In an embodiment, the sensor layer 200 may be formed on the display panel DP through a subsequent process. In such an embodiment, the sensor layer 200 may be directly disposed on the display panel DP. Here, the expression that the sensor layer 200 is directly disposed on the display panel DP may mean that a third component is not disposed between the sensor layer 200 and the display panel DP. That is, a separate adhesive member may not be disposed between the sensor layer 200 and the display panel DP.

The anti-reflection layer 300 may be directly disposed on the sensor layer 200. The anti-reflection layer 300 may reduce reflectance of external light incident from the outside of the display device DD. In an embodiment, the anti-reflection layer 300 may be formed on the sensor layer 200 through a continuous process. The anti-reflection layer 300 may include color filters. The color filters may have predetermined arrangement. In an embodiment, for example, the color filters may be arranged in consideration of light emission colors of the pixels included in the display panel DP. Further, the anti-reflection layer 300 may further include a black matrix adjacent to the color filters. The anti-reflection layer 300 will be described in detail below.

In an embodiment of the present disclosure, the sensor layer 200 may be omitted. In such an embodiment, the anti-reflection layer 300 may be directly disposed on the display panel DP. In an embodiment of the present disclosure, positions of the sensor layer 200 and the anti-reflection layer 300 may be interchanged.

Although not illustrated, in an embodiment of the present disclosure, the display device DD may further include an optical layer disposed on the anti-reflection layer 300. In an embodiment, for example, the optical layer may be formed on the anti-reflection layer 300 through a continuous process. The optical layer may control a direction of light incident from the display panel DP to improve front luminance of the display device DD. In an embodiment, for example, the optical layer may include an organic insulating layer in which openings are defined to correspond to light emission areas of the pixels included in the display panel DP and a high refractive index layer which covers the organic insulating layer and is filled in the openings. The high refractive index layer may have a higher refractive index than that of the organic insulating layer.

The window 400 may provide a front surface of the electronic device 1000. The window 400 may include a glass film or synthetic resin film as a base film. The window 400 may further include an anti-reflection layer or an anti-fingerprint layer. The window 400 may include a glass film or synthetic resin film.

Figure 4:
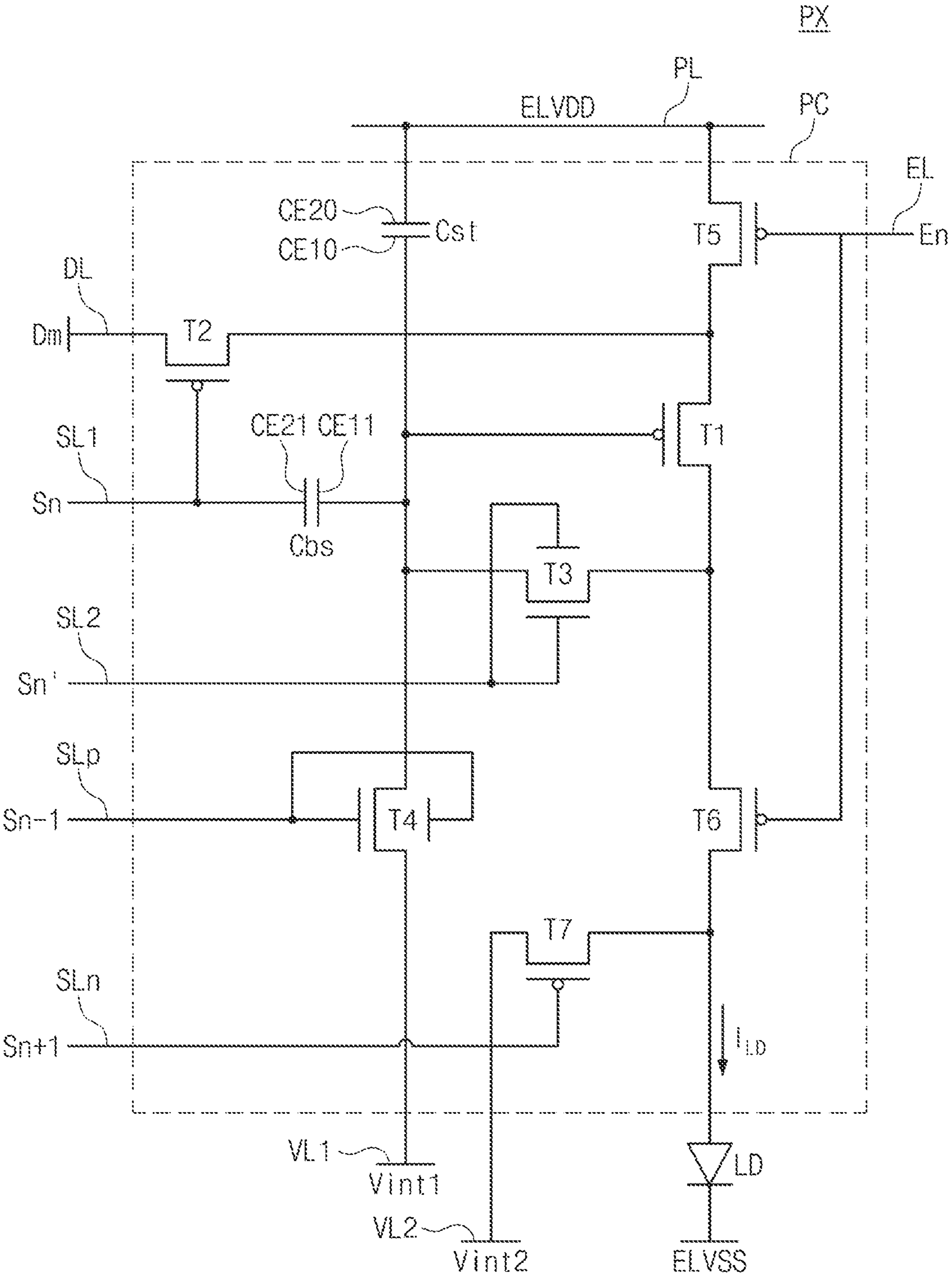
FIG. 4 is an equivalent circuit diagram of a pixel according to an embodiment of the present disclosure.

FIG. 4 is an equivalent circuit diagram of a pixel PX according to an embodiment of the present disclosure.

Referring to FIG. 4, an equivalent circuit diagram of one pixel PX among the plurality of pixels PX illustrated in FIG. 2 is illustrated. The pixel PX may include a light emission element LD and a pixel circuit PC. The light emission element LD may be included in the light emitting element layer 130 of FIG. 3, and the pixel circuit PC may be included in the circuit layer 120 of FIG. 3.

The pixel circuit PC may include a plurality of transistors T1 to T7 (or thin-film transistors) and a storage capacitor Cst. The plurality of transistors T1 to T7 and the storage capacitor Cst may be electrically connected to signal lines SL1, SL2, SLp, SLn, EL, and DL, a first initialization voltage line VL1, a second initialization voltage line VL2 (or an anode initialization voltage line), and a driving voltage line PL.

The plurality of transistors T1 to T7 may include a driving transistor T1 (or a first transistor), a switching transistor T2 (or a second transistor), the compensation transistor T3 (or a third transistor), a first initialization transistor T4 (or a fourth transistor), an operation control transistor T5 (or a fifth transistor), a light emission control transistor T6 (or a sixth transistor), and a second initialization transistor T7 (or a seventh transistor).

The light emission element LD may include a first electrode (for example, an anode electrode or pixel electrode) and a second electrode (for example, a cathode electrode or common electrode), the first electrode of the light emission element LD may be connected to the driving transistor T1 by means of (or via) the light emission control transistor T6 to receive a driving current $I_{LD}$, and the second electrode may receive a low power supply voltage ELVSS. The light emission element LD may generate light having a luminance corresponding to the driving current $I_{LD}$.

Some of the plurality of transistors T1 to T7 may be n-channel metal-oxide semiconductor field-effect-transistors (MOSFETs) (NMOSs), and the other thereof may be p-channel MOSFETs (PMOSs). In an embodiment, for example, among the plurality of transistors T1 to T7, the compensation transistor T3 and the first initialization transistor T4 may be NMOSs, and the other thereof may be PMOSs.

According to an embodiment of the present disclosure, among the plurality of transistors T1 to T7, the compensation transistor T3, the first initialization transistor T4, and the second initialization transistor T7 may be NMOSs, and the other thereof may be PMOSs. According to an alternative embodiment of the present disclosure, only one of the plurality of transistors T1 to T7 may be an NMOS, and the other thereof may be PMOSs. According to another alternative embodiment of the present disclosure, all of the plurality of transistors T1 to T7 may be NMOSs or PMOSs.

The signal lines may a the first current scan line SL1 through which a first scan signal Sn is transmitted, a second current scan line SL2 through which a second scan signal Sn' is transmitted, a prior scan line SLp through which a prior scan signal Sn−1 is transmitted to the first initialization transistor T4, a light emission control line EL through which a light emission control signal En is transmitted to the operation control transistor T5 and the light emission control transistor T6, a next scan line SLn through which a next scan signal Sn+1 is transmitted to the second initialization transistor T7, and a data line DL which intersects the first current scan line SL1 and through which a data signal Dm is transmitted.

The driving voltage line PL may transmit a driving voltage ELVDD to the driving transistor T1, and the first initialization voltage line VL1 may transmit an initialization voltage Vint1 that initializes the driving transistor T1 and the first electrode of the light emission element LD.

A gate of the driving transistor T1 may be connected to the storage capacitor Cst, a source of the driving transistor T1 may be connected to the driving voltage line PL via the operation control transistor T5, and a drain of the driving transistor T1 may be electrically connected to the first electrode of the light emission element LD via the light emission control transistor T6. The driving transistor T1 may receive the data signal Dm based on a switching operation of the switching transistor T2 to supply the driving current $I_{LD}$ to the light emission element LD.

A gate of the switching transistor T2 may be connected to the first current scan line SL1 through which the first scan signal Sn is transmitted, a source of the switching transistor T2 may be connected to the data line DL, and a drain of the switching transistor T2 may be connected to the driving voltage line PL via the operation control transistor T5 while being connected to the source of the driving transistor T1. The switching transistor T2 may be turned on in response to the first scan signal Sn received through the first current scan line SL1 and perform a switching operation of transmitting the data signal DM transmitted to the data line DL to the source of the driving transistor T1.

A gate of the compensation transistor T3 is connected to the second current scan line SL2. A drain of the compensation transistor T3 may be connected to the first electrode of the light emission element LD via the light emission control transistor T6 while being connected to the drain of the driving transistor T1. A source of the compensation transistor T3 may be connected to a first electrode CE10 of the storage capacitor Cst and the gate of the driving transistor T1. Further, the source of the compensation transistor T3 may be connected to a drain of the first initialization transistor T4.

The compensation transistor T3 may be turned on in response to the second scan signal Sn' received through the second current scan line SL2 and electrically connect the gate and drain of the driving transistor T1 to diode-connect the driving transistor T1.

A gate of the first initialization transistor T4 may be connected to the prior scan line SLp. A source of the first initialization transistor T4 may be connected to a source of the second initialization transistor T7 and the first initialization voltage line VL1. A drain of the first initialization transistor T4 may be connected to the first electrode CE10 of the storage capacitor Cst, the source of the compensation transistor T3, and the gate of the driving transistor T1. The first initialization transistor T4 may be turned on in response to the prior scan signal Sn−1 received through the prior scan line SLp and thus perform an initialization operation of initializing a voltage of the gate of the driving transistor T1 by transmitting the initialization voltage Vint1 to the gate of the driving transistor T1.

A gate of the operation control transistor T5 may be connected to the light emission control line EL, an operation control source of the operation control transistor T5 may be connected to the driving voltage line PL, and a drain of the operation control transistor T5 may be connected to the source of the driving transistor T1 and the drain of the switching transistor T2.

A gate of the light emission control transistor T6 may be connected to the light emission control line EL, a light emission control source of the light emission control line T6 may be connected to the drain of the driving transistor T1 and the drain of the compensation transistor T3, and a drain of the light emission control transistor T6 may be electrically connected to a drain of the second initialization transistor T7 and the first electrode of the light emission element LD.

The operation control transistor T5 and the light emission control transistor T6 are simultaneously turned on in response to the light emission control signal En received through the light emission control line EL and transmit the driving voltage ELVDD to the light emission element LD so that the driving current $I_{LD}$ flows through the light emission element LD.

A gate of the second initialization transistor T7 may be connected to the next scan line SLn, the drain of the second initialization transistor T7 may be connected to the drain of the light emission control transistor T6 and the first electrode of the light emission element LD, and a source of the second initialization transistor T7 may be connected to the second initialization voltage line VL2 to receive an anode initialization voltage Vint2. The second initialization transistor T7 is turned on in response to the next scan signal Sn+1 received through the next scan line SLn and initializes the first electrode of the light emission element LD.

As an embodiment, the second initialization transistor T7 may be connected to the light emission control line EL and driven based on the light emission control signal En. In an embodiment, positions of the source and drain may be interchanged according to a type (a p-type or n-type) of the transistor.

The storage capacitor Cst may include the first electrode CE10 and a second electrode CE20. The first electrode CE10 of the storage capacitor Cst is connected to the gate of the driving transistor T1, and the second electrode CE20 of the storage capacitor Cst is connected to the driving voltage line PL. The storage capacitor Cst may store charges corresponding to a difference between a voltage of the gate of the driving transistor T1 and the driving voltage ELVDD.

A boosting capacitor Cbs may include a first electrode CE1*l* and a second electrode CE21. The first electrode CE11 of the boosting capacitor Cbs may be connected to the first electrode CE10 of the storage capacitor Cst, and the second electrode CE21 of the boosting capacitor Cbs may receive the first scan signal Sn. The boosting capacitor Cbs may increase the voltage of the gate of the driving transistor T1 at a time point when the provision of the first scan signal Sn is stopped, making it possible to compensate for a voltage drop at the gate.

A detailed operation of each pixel PX according to an embodiment will be described below.

During an initialization period, when the prior scan signal Sn−1 is supplied through the prior scan line SLp, the first initialization transistor T4 is turned on in response to the prior scan signal Sn−1, and the driving transistor T1 is initialized by the initialization voltage Vint1 supplied from the first initialization voltage line VL1.

During a data programming period, when the first scan signal Sn and the second scan signal Sn' are supplied through the first current scan line SL1 and the second current scan line SL2, the switching transistor T2 and the compensation transistor T3 are turned on in response to the first scan signal Sn and the second scan signal Sn'. In this case, the driving transistor T1 is diode-connected and forward biased by the turned-on compensation transistor T3.

Then, a compensation voltage (Dm+Vth, Vth has a negative value) obtained by subtracting a threshold voltage (Vth) of the driving transistor T1 from the data signal Dm supplied from the data line DL is applied to the gate of the driving transistor T1.

The driving voltage ELVDD and the compensation voltage (Dm+Vth) are applied to both ends of the storage capacitor Cst, and charges corresponding to a voltage difference between both ends thereof are stored in the storage capacitor Cst.

During a light emission period, the operation control transistor T5 and the light emission control transistor T6 are turned on by the light emission control signal En supplied from the light emission control line EL. The driving current $I_{LD}$ occurs according to a voltage difference between the voltage of the gate of the driving transistor T1 and the driving voltage ELVDD, and the driving current $I_{LD}$ is supplied to the light emission element LD through the light emission control transistor T6.

In an embodiment, at least one of the plurality of transistors T1 to T7 includes a semiconductor layer including or containing oxide, and the others thereof include a semiconductor layer including or containing silicon.

In an embodiment, the driving transistor T1, which directly affects the brightness of the display device, includes a highly reliable polycrystalline silicon semiconductor layer, and therefore, a high-resolution display device may be implemented.

In an embodiment, since the oxide semiconductor has high carrier mobility and low leakage current, a voltage drop is not large even when a driving time is long. That is, since a change in a color of the image due to the voltage drop is not large even during low-frequency driving, low frequency driving may be performed.

In such an embodiment, since the oxide semiconductor has a low leakage current, at least one among the compensation transistor T3, the first initialization transistor T4, and the second initialization transistor T7 connected to the gate of the driving transistor T1 may be adopted as the oxide transistor, and thus leakage current that may flow to the gate may be prevented, and at the same time, power consumption may be reduced.

FIG. 5 is a plan view of the display panel DP according to an embodiment of the present disclosure.

Referring to FIG. 5, an embodiment of the display panel DP may include the display area DP-A and a peripheral area DP-NA. The peripheral area DP-NA may be adjacent to the display area DP-A and surround at least a portion of the display area DP-A. The peripheral area DP-NA may correspond to the non-display area 100N of FIG. 3.

The display area DP-A may include a first area DP-A1 and a second area DP-A2. The second area DP-A2 may include a first second area (hereinafter, will be referred to as "(2-1)$^{th}$ area") DP-A2-1 and a second second area (hereinafter, will be referred to as "(2-2)$^{th}$ area") DP-A2-2. The (2-1)$^{th}$ area DP-A2-1 may overlap (or correspond to) the sensing area 1000SA illustrated in FIG. 1 or the sensing area 100SA illustrated in FIG. 2. In an embodiment, the (2-1)$^{th}$ area DP-A2-1 has a circular shape, but may have various shapes such as a polygon, an ellipse, a figure having at least one curved side, or an atypical shape, and the present disclosure is not limited to an embodiment.

The display panel DP may include a plurality of pixels PX. The display panel DP may include a first pixel PX1 including a light emission element disposed in the first area DP-A1, a first second (hereinafter, will be referred to as "(2-1)$^{th}$ pixel") PX2-1 including a light emission element disposed in the (2-1)$^{th}$ area DP-A2-1, and a second second pixel (hereinafter, will be referred to as "(2-2)$^{th}$ pixel PX2-2") including a light emission element disposed in the (2-2)$^{th}$ area DP-A2-2. Each of the first pixel PX1, the (2-1)$^{th}$ pixel PX2-1, and the (2-2)$^{th}$ pixel PX2-2 may include the pixel circuit PC illustrated in FIG. 4.

Each of the first pixel PX1, the (2-1)$^{th}$ pixel PX2-1, and the (2-2)$^{th}$ pixel PX2-2 may be provided in plurality. In such an embodiment, the first to (2-2)$^{th}$ pixels PX1, PX2-1, and PX2-2 may include a red pixel, a green pixel, and a blue pixel, respectively, and alternatively, may further include a white pixel.

The first area DP-A1, the (2-1)$^{th}$ area DP-A2-1, and the (2-2)$^{th}$ area DP-A2-2 may be distinguished one from another based on light transmittance or resolution. The light transmittance and resolution are measured within a reference area.

The (2-1)$^{th}$ area DP-A2-1 has higher light transmittance than those of the first area DP-A1 and the (2-2)$^{th}$ area DP-A2-2. This is because the (2-1)$^{th}$ area DP-A2-1 has an occupied area ratio of a light blocking structure, which is lower than those of the first area DP-A1 and the (2-2)$^{th}$ area DP-A2-2. The light blocking structure may include a conductive pattern, a pixel defining film, a pixel defining pattern, or the like of a circuit layer.

The first area DP-A1 may have higher resolution than those of the (2-1)$^{th}$ area DP-A2-1 and the (2-2)$^{th}$ area DP-A2-2. In the first area DP-A1, a larger number of light emission elements are arranged within a reference area or a unit area (or the same area), as compared to the (2-1)$^{th}$ area DP-A2-1 and the (2-2)$^{th}$ area DP-A2-2.

When distinguished on the basis of the light transmittance, the (2-1)$^{th}$ area DP-A2-1 may be a first transmittance area, and the first area DP-A1 and the (2-2)$^{th}$ area DP-A2-2 may be second transmittance areas distinguished from the first transmittance area. The first area DP-A1 and the (2-2)$^{th}$ area DP-A2-2 may have substantially the same transmittance as each other. In an embodiment where the transmittances of the first area DP-A1 and the (2-2)$^{th}$ area DP-A2-2 are not the same as each other, the transmittance of the (2-1)$^{th}$ area DP-A2-1 is significantly higher than those of the first area DP-A1 and the (2-2)$^{th}$ area DP-A2-2. Thus, when the (2-1)$^{th}$ area DP-A2-1 is defined as the first transmittance area, the first area DP-A1 and the (2-2)$^{th}$ area DP-A2-2 may be defined as the second transmittance area.

When distinguished on the basis of the resolution, the first area DP-A1 may be a first resolution area, and the (2-1)$^{th}$ area DP-A2-1 and the (2-2)$^{th}$ area DP-A2-2 may be second resolution areas distinguished from the first resolution area. The number of light emission elements per a reference area (or a unit area) of the (2-1)$^{th}$ area DP-A2-1 may be substantially the same as the number of light emission elements per reference area of the (2-2)$^{th}$ area DP-A2-2.

Figure 6:
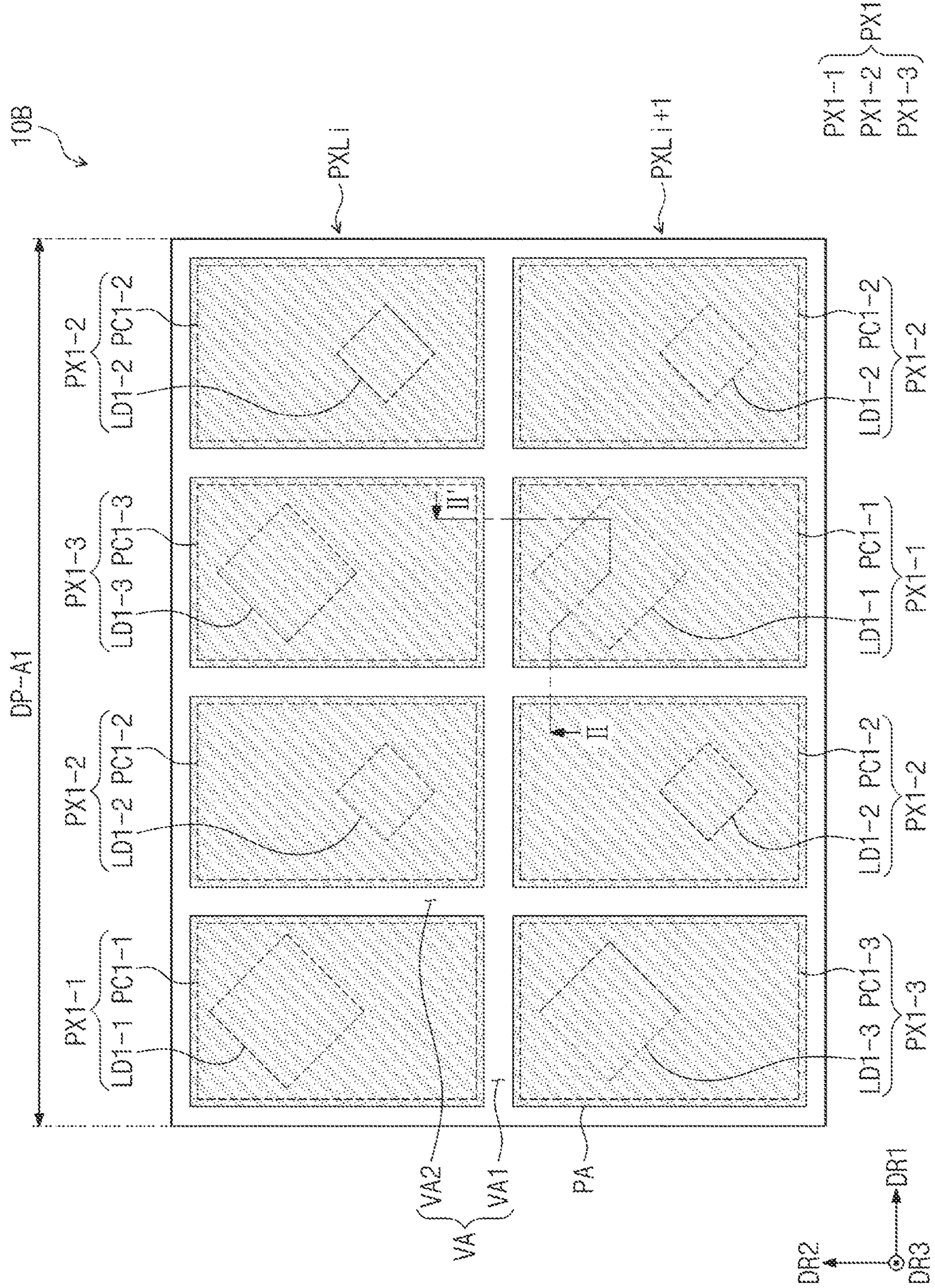
FIG. 6 is an enlarged plan view of part 10B of FIG. 5 according to an embodiment of the present disclosure.

FIG. 6 is an enlarged plan view of part 10B of FIG. 5.

Referring to FIG. 6, the first pixel PX1 corresponding to two pixel rows PXLi and PXLi+1 of the first area DP-A1 is enlargedly illustrated. An i$^{th}$ pixel row PXLi may include a first color pixel PX1-1, a second color pixel PX1-2, a third color pixel PX1-3, and the second color pixel PX1-2 which are arranged in the first direction DR1. An (i+1)$^{th}$ pixel row PXLi+1 may include the third color pixel PX1-3, the second color pixel PX1-2, the first color pixel PX1-1, and the second color pixel PX1-2 which are arranged in the first direction DR1.

The four color pixels of the pixel rows PXLi and PXLi+1 illustrated in FIG. 6 may be repeatedly arranged in the first direction DR1. The pixel rows PXLi and PXLI+1 may be repeatedly arranged in the second direction DR2. In FIG. 6, anodes of a first first emission element (hereinafter, will be referred to as "(1-1)$^{th}$ light emission element") LD1-1, a second first emission element (hereinafter, will be referred to as "(1-2)$^{th}$ light emission element") LD1-2, and a third first emission element (hereinafter, will be referred to as "(1-3)$^{th}$ light emission element") LD1-3 are illustrated by dotted lines.

The first area DP-A1 may include a plurality of pixel areas PA and a boundary area VA between the plurality of pixel areas PA. The boundary area VA may be disposed adjacent to at least portions of the plurality of pixel areas PA. The boundary area VA may block an external impact and an internal impact from being transferred to the pixel areas PA.

Referring to FIG. 6, one of the first color pixel PX1-1, the second color pixel PX1-2, and the third color pixel PX1-3 may be disposed in each of the pixel areas PA, and each of the pixel areas PA may be surrounded by the boundary area VA. The boundary area VA may include a first boundary area VA1 extending in the first direction DR1 and a second boundary area VA2 extending in the second direction DR2.

Pixel circuits PC1-1, PC1-2, and PC1-3 of the first color pixel to the third color pixel PX1-1, PX1-2, and PX1-3 are arranged in the plurality of pixel areas PA. Each of the pixel circuits PC1-1, PC1-2, and PC1-3 is the same as the pixel circuit PC described with reference to FIG. 4. FIG. 6 illustrates an embodiment where each of the pixel circuits PC1-1, PC1-2, and PC1-3 substantially coincides with or is disposed to overlap the pixel areas PA, but the present disclosure is not limited thereto.

In an embodiment, the pixel areas PA may be defined as areas other than the boundary area VA within the first area DP-A1. The boundary area VA is an area defined by a third through-hole CH3 (see FIG. 7), which will be described below, and the first area DP-A1 not overlapping the third through-hole CH3 corresponds to the pixel area PA.

The arrangement of the pixel areas PA and the boundary area VA illustrated in FIG. 6 is illustrative, and the arrangement of the pixel areas PA and the boundary area VA may be variously changed or modified as desired. In an embodiment, for example, two adjacent color pixels among the first color pixel PX1-1, the second color pixel PX1-2, the third color pixel PX1-3, and the second color pixel PX1-2 may be surrounded by the boundary area VA.

Figure 7:
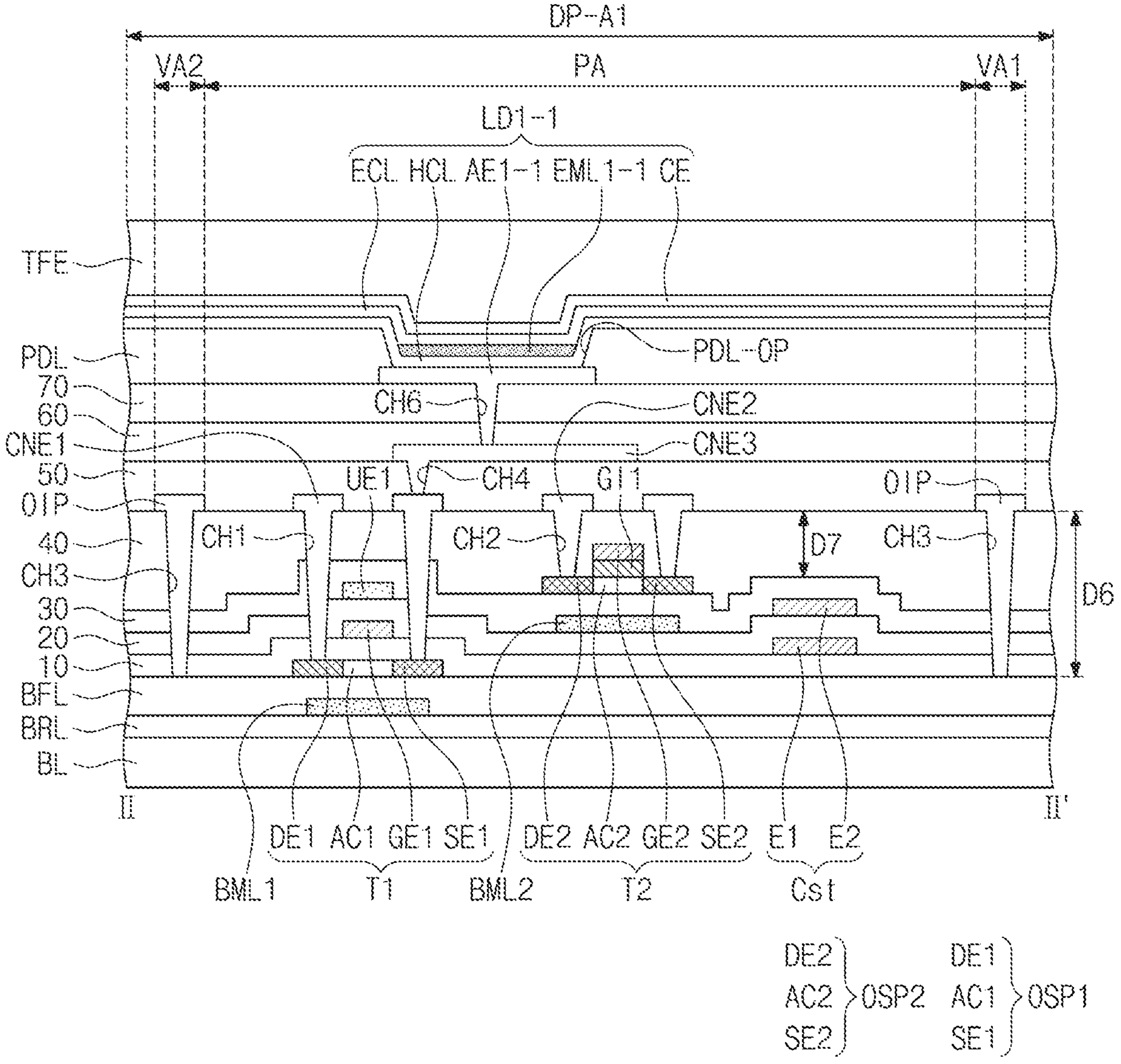
FIG. 7 is a cross-sectional view along line II-II' of FIG. 6 according to an embodiment of the present disclosure.

FIG. 7 is a cross-sectional view along line II-II' of FIG. 6. FIG. 7 illustrates the (1-1)$^{th}$ light emission element LD1-1, the first transistor T1, and the second transistor T2. Here, the first transistor T1 may be a silicon transistor, and the second transistor T2 may be an oxide transistor.

A base layer BL may overlap the pixel areas PA and the boundary area VA. The base layer BL may overlap the peripheral area DP-NA (see FIG. 5) as well as the display area DP-A (see FIG. 5) including the first area DP-A1 of FIG. 5. FIG. 7 illustratively illustrates one pixel area among the plurality of pixel areas PA and the first boundary area VA1 and the second boundary area VA2 adjacent to the one pixel area.

A plurality of inorganic layers BRL and BFL may be arranged on the base layer BL. The inorganic layers BRL and BFL may include the barrier layer BRL and the buffer layer BFL. Like the base layer BL, the inorganic layers BRL and BFL may overlap the non-display area DP-NA (see FIG. 5) as well as the display area DP-A including the first area DP-A1.

The barrier layer BRL may prevent inflow of foreign substances from the outside. The barrier layer BRL may include at least one inorganic layer. The barrier layer BRL may include a silicon oxide layer and a silicon nitride layer. Each of the silicon oxide layer and the silicon nitride layer may be provided in plurality and the silicon oxide layers and the silicon nitride layers may be alternately stacked one on another.

A first rear surface metal pattern BML1 may be disposed on the barrier layer BRL. The first rear surface metal pattern BML1 may include a metal. The first rear surface metal pattern BML1 may include molybdenum (Mo) having high heat resistance, an alloy containing molybdenum, titanium (Ti), or an alloy containing titanium. The first rear surface metal pattern BML1 may receive a bias voltage. The first rear surface metal pattern BML1 may receive the driving voltage ELVDD. The first rear surface metal pattern BML1 may block an electric potential due to a polarization phenomenon from affecting the first transistor T1. The first rear surface metal pattern BML1 may block external light from reaching the first transistor T1.

The buffer layer BFL may be disposed on the barrier layer BRL. The buffer layer BFL may cover the first rear surface metal pattern BML1. The buffer layer BFL may prevent metal atoms or impurities from being diffused from the base layer BL to a first semiconductor pattern OSP1. The buffer layer BFL may include at least one inorganic layer. In an embodiment, for example, the buffer layer BFL may include a silicon oxide layer and a silicon nitride layer.

The first semiconductor pattern OSP1 may be disposed on the buffer layer BFL. The first semiconductor pattern OSP1 may include a silicon semiconductor. In an embodiment, for example, the silicon semiconductor may include amorphous silicon, polycrystalline silicon, or the like. In an embodiment, for example, the first semiconductor pattern OSP1 may include low-temperature poly (polycrystalline) silicon.

The first semiconductor pattern OSP1 may have different electrical properties depending on whether the first semiconductor pattern OSP1 is doped. The first semiconductor pattern OSP1 may include a first area having higher conductivity and a second area having lower conductivity. The first area may be doped with an N-type dopant or a P-type dopant. A P-type transistor may include a doping area doped with the P-type dopant, and an N-type transistor may include a doping area doped with the N-type dopant. The second area may be a non-doping area or may be an area doped at a concentration lower than the concentration of the first area.

A conductivity of the first area is greater than a conductivity of the second area, and the first area may substantially serve as an electrode or a signal line. The second area may substantially correspond to a channel area (or an active area) of the transistor. In such an embodiment, a portion of the first semiconductor pattern OSP1 may be a channel of the transistor, another portion of the first semiconductor pattern OSP1 may be a source or drain of the transistor, and still another portion of the first semiconductor pattern OSP1 may be a connection electrode or connection signal line.

A first source area SE1, a first active area AC1, and a first drain area DE1 of the first transistor T1 may be formed from (or defined by portions of) the first semiconductor pattern OSP1. The first source area SE1 and the first drain area DE1 may extend in opposite directions from the first active area AC1 in cross section.

A plurality of insulating layers 10 to 70 may be arranged on the plurality of inorganic layers BRL and BFL. The first insulating layer 10 may be disposed on the buffer layer BFL. The first insulating layer 10 may cover the first semiconductor pattern OSP1. The first insulating layer 10 may include at least one selected from an aluminum oxide, a titanium oxide, a silicon oxide, a silicon nitride, a silicon oxynitride, a zirconium oxide, and a hafnium oxide.

The first insulating layer 10 may be a single-layer silicon oxide layer. The plurality of insulating layers 10 to 70 as well as the first insulating layer 10 may have a single-layer or multi-layer structure and may include at least one selected from the above-described materials, but the present disclosure is not limited thereto.

A first electrode E1 of the capacitor Cst may be disposed on the first insulating layer 10.

The second insulating layer 20 may be disposed on the first insulating layer 10 and cover a first gate GE1. An upper electrode UE1 overlapping the first gate GE1 may be disposed on the second insulating layer 20. A second electrode E2 overlapping the first electrode E1 of the capacitor CST may be disposed on the second insulating layer 20. The second electrode E2 and the upper electrode UE1 may include molybdenum (Mo) having high heat resistance, an alloy containing molybdenum, titanium (Ti), an alloy containing titanium.

A second rear surface metal pattern BML2 may be disposed on the second insulating layer 20. The second rear surface metal pattern BML2 may be disposed to correspond to a lower portion of the second transistor T2. In an alternative embodiment of the present disclosure, the second rear surface metal pattern BML2 may be omitted. According to an embodiment of the present disclosure, the first rear surface metal pattern BML1 may extend to a lower portion of the second transistor T2 and thus functions as the second rear surface metal pattern BML2.

The third insulating layer 30 may be disposed on the second insulating layer 20. The third insulating layer 30 may cover the upper electrode UE1, the second rear surface metal pattern BML2, and the second electrode E2. A second semiconductor pattern OSP2 may be disposed on the third insulating layer 30. The second semiconductor pattern OSP2 may include an oxide semiconductor. The second semiconductor pattern OSP2 may include a transparent conductive oxide (TCO) such as indium tin oxide (ITO), indium zinc oxide (IZO), indium gallium zinc oxide (IGZO), zinc oxide ($ZnO_x$), or indium oxide ($In_2O_3$).

A second source area SE2, a second active area AC2, and a second drain area DE2 of the second transistor T2 may be formed from the second semiconductor pattern OSP2. The second source area SE2 and the second drain area DE2 may extend in opposite directions from the second active area AC2 in cross section.

The oxide semiconductor may include a plurality of regions distinguished according to whether the TCO is reduced. An area (hereinafter, referred to as a reduced area) in which the TCO is reduced has higher conductivity than that of an area (hereinafter, a non-reduced area) in which the TCO is not reduced. The reduced area substantially serves as a source/drain of a transistor or a signal line. The non-reduced area substantially corresponds to a semiconductor area (or a channel) of the transistor. In other words, a partial area of the second semiconductor pattern OSP2 may be a semiconductor area of the transistor, another partial area thereof may be a source area/drain area of the transistor, and still another partial area thereof may be a signal transmission area.

A gate insulating pattern GI1 may be disposed on the second active area AC2. The gate insulating pattern GI1 may be positioned between a second gate GE2, which will be described below, and the second semiconductor pattern OSP2. The gate insulating pattern GI1 may overlap the second gate GE2 in a plan view or when viewed in a thickness direction of the base layer BL.

The second gate GE2 may be disposed on the gate insulating pattern GI1. The second gate GE2 may be a portion of a metal pattern. The second gate GE2 may overlap the second active area AC2 of the second transistor T2. The second gate GE2 may include molybdenum (Mo) having high heat resistance, an alloy containing molybdenum, titanium (Ti), or an alloy containing titanium. In an embodiment, for example, the second gate GE2 may include a titanium layer and a molybdenum layer disposed on the titanium layer.

The fourth insulating layer 40 may be disposed on the third insulating layer 30. The fourth insulating layer 40 may cover the second semiconductor pattern OSP2, the gate insulating pattern GI1, and the second gate GE2. Each of the first to fourth insulating layers 10 to 40 may be an inorganic layer.

The third through-hole CH3 may be defined in the first to fourth insulating layers 10 to 40. The third through-hole CH3 may correspond to the boundary area VA described with reference to FIG. 6, and the third through-hole CH3 may form a valley in the display panel DP. The third through-hole CH3 disposed on a right side of FIG. 7 may correspond to the first boundary area VA1 (see FIG. 6), and the third through-hole CH3 disposed on a left side of FIG. 7 may correspond to the second boundary area VA2 (see FIG. 6). The third through-hole CH3 may expose an upper surface of the buffer layer BFL.

In such an embodiment, the first to fourth insulating layers 10 to 40 may be divided into a plurality of islands to correspond to the plurality of pixels PX1-1, PX1-2, and PX1-3 illustrated in FIG. 6. An impact applied from the outside may be concentrated in the third through-hole CH3 to prevent cracks from occurring in the first to fourth insulating layers 10 to 40. In such an embodiment, the third through-hole CH3 may prevent a crack occurring in a specific pixel area from being expanded to a pixel area adjacent thereto.

An organic pattern OIP may be disposed inside the third through-hole CH3. The organic pattern OIP may be disposed inside the third through-hole CH3 and may be in contact with inner surfaces of the first to fourth insulating layers 10 to 40 defining the third through-hole CH3. The organic pattern OIP may include or be formed of a material having a lower elastic modulus than that of the fifth insulating layer 50. The organic pattern OIP may absorb an external impact concentrated on the third through-hole CH3 to reduce defects of the display panel DP.

The fifth insulating layer 50 may be disposed on the fourth insulating layer 40. A first connection electrode CNE1 may be connected to at least one of the first drain area DE1 and the first source area SE1 of the first transistor T1 through a first through-hole CH1 defined through the first to fourth insulating layers 10 to 40.

A second connection electrode CNE2 may be connected to at least one selected from the second drain area DE2 and the second source area SE2 of the second transistor T2 through a second through-hole CH2 defined through the fourth insulating layer 40.

The fifth insulating layer 50 may be disposed on the fourth insulating layer 40. The fifth insulating layer 50 may remove steps formed in lower insulating layers and provide a flat upper surface. The fifth insulating layer 50 may cover the first connection electrode CNE1, the second connection electrode CNE2, and the organic pattern OIP. A third connection electrode CNE3 may be disposed on the fifth insulating layer 50. The third connection electrode CNE3 may be connected to the first connection electrode CNE1 through a fourth through-hole CH4 defined through the fifth insulating layer 50.

The sixth insulating layer 60 may be disposed on the fifth insulating layer 50. The sixth insulating layer 60 may cover the third connection electrode CNE3. The seventh insulating layer 70 may be disposed on the sixth insulating layer 60.

Each of the fifth to seventh insulating layers 50, 60, and 70 may be an organic layer. In an embodiment, for example, each of the fifth to seventh insulating layers may include general purpose polymers such as benzocyclobutene (BCB), polyimide, hexamethyldisiloxane (HMDSO), polymethylmethacrylate (PMMA), and polystyrene (PS), a polymer derivative having a phenolic group, an acrylic polymer, an imide polymer, an arylether polymer, an amide polymer, a fluorine polymer, a p-xylene-based polymer, a vinyl alcohol-based polymer, or blends thereof.

A first first anode (hereinafter, will be referred to as "(1-1)$^{th}$ anode") AE1-1 of the (1-1)$^{th}$ light emission element LD1-1 may be disposed on the seventh insulating layer 70. The (1-1)$^{th}$ anode AE1-1 may be connected to the third connection electrode CNE3 through a sixth through-hole CH6 defined through the sixth insulating layer 60 and the seventh insulating layer 70. The (1-1)$^{th}$ light emission element LD1-1 may include the (1-1)$^{th}$ anode AE1-1, a first first light emission layer EML1-1 (hereinafter, will be referred to as "(1-1)$^{th}$ light emission layer") EML1-1, and a cathode CE. The cathode CE may be commonly provided to the (1-1)$^{th}$ light emission element LD1-1, the (1-2)$^{th}$ light emission element LD1-2, and the (1-3)$^{th}$ light emission element LD1-3.

The (1-1)$^{th}$ anode AE1-1 may be a transparent electrode, a translucent electrode, or a reflective electrode. According to an embodiment of the present disclosure, the (1-1)$^{th}$ anode AE1-1 may include a reflective layer including or formed of Ag, Mg, A1, Pt, Pd, Au, Ni, Nd, Ir, Cr or a compound thereof, and a transparent or translucent electrode layer formed on the reflective layer. The transparent or translucent electrode layer may include at least one selected indium tin oxide (ITO), indium zinc oxide (IZO), indium gallium zinc oxide (IGZO), zinc oxide ($ZnO_x$) or indium oxide ($In_2O_3$), and aluminum-doped zinc oxide (AZO). In an embodiment, for example, the (1-1)$^{th}$ anode AE1-1 may include a laminated structure of ITO/Ag/ITO.

A pixel defining film PDL may be disposed on the seventh insulating layer 70. The pixel defining film PDL may have a transparent property or a light absorbing property. In an embodiment, for example, the pixel defining film PDL absorbing light may include a black coloring agent. The black coloring agent may include black dye and black pigment. The black coloring agent may include carbon black, metal such as chromium, or an oxide thereof. The pixel defining film PDL may correspond to a shielding pattern having light blocking characteristics.

The pixel defining film PDL may cover a portion of the (1-1)$^{th}$ anode AE1-1. In an embodiment, for example, an opening PDL-OP exposing a portion of the (1-1)$^{th}$ anode AE1-1 may be defined in the pixel defining film PDL. The pixel defining film PDL may increase a distance between an edge of the (1-1)$^{th}$ anode AE1-1 and the cathode CE. Thus, an arc or the like may be prevented from occurring at the edge of the (1-1)$^{th}$ anodes AE1-1 by the pixel defining film PDL.

A hole control layer HCL may be disposed between the anode AE1-1 and the (1-1)$^{th}$ light emission layer EML1-1. The hole control layer HCL may include a hole transport layer and a hole injection layer. An electron control layer ECL may be disposed between the (1-1)$^{th}$ light emission layer EML1-1 and the cathode CE. The electron control layer ECL may include an electron transport layer and an electron injection layer. The hole control layer HCL and the electron control layer ECL may be commonly formed in the plurality of pixel rows PXLi and PXLi+1 (see FIG. 4B) using an open mask.

An encapsulation layer TFE may be disposed on the (1-1)$^{th}$ light emission element LD1-1. The encapsulation layer TFE may include an encapsulation inorganic layer and an encapsulation organic layer, which are sequentially stacked. A plurality of encapsulation inorganic layers and a plurality of encapsulation organic layers may be alternately arranged. However, layers constituting the encapsulation layer TFE are not limited thereto, and may be variously arranged.

The encapsulation inorganic layer may protect the (1-1)$^{th}$ light emission element LD1-1 from moisture and oxygen, and the encapsulation organic layer may protect the (1-1)$^{th}$ light emission element LD1-1 from foreign substances such as dust particles.

Figure 8:
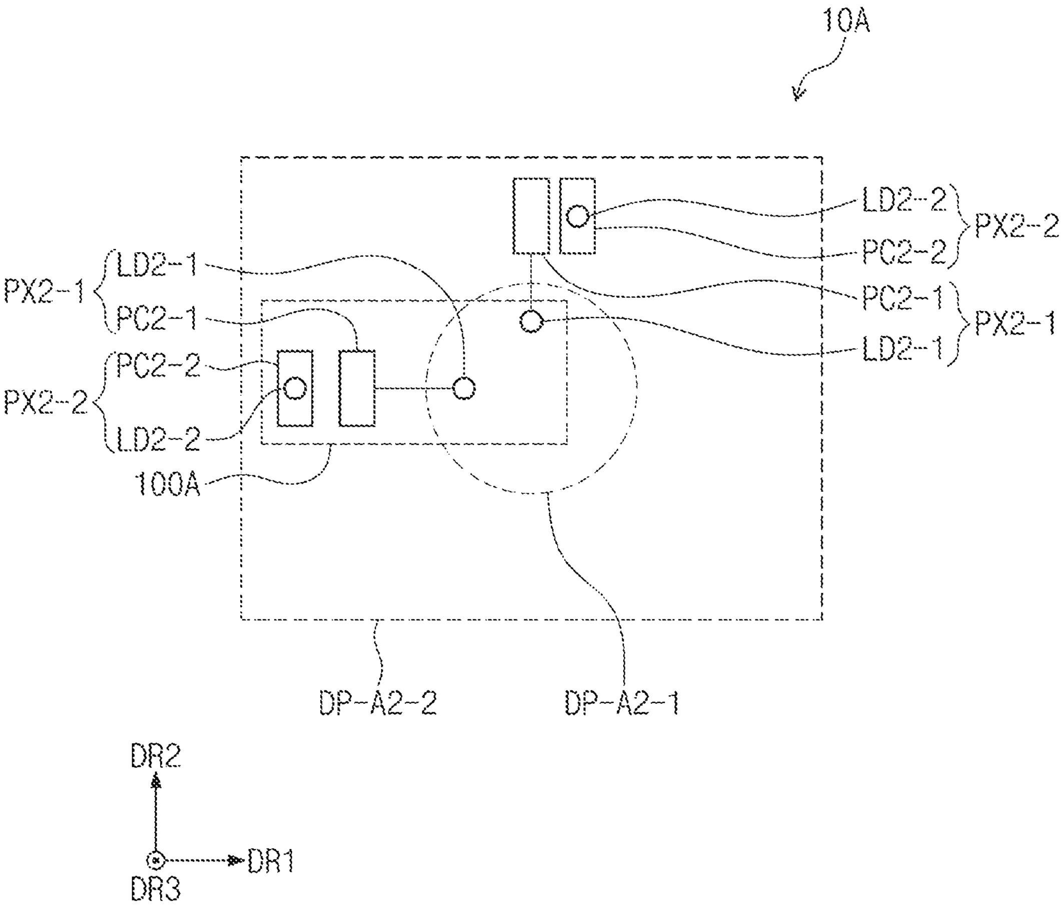
FIG. 8 is an enlarged view of part 10A of FIG. 5 according to an embodiment of the present disclosure.

FIG. 8 is an enlarged plan view of part 10A of FIG. 5.

Referring to FIG. 8, the (2-1)$^{th}$ pixel PX2-1 may include a first second light emission element (hereinafter, will be referred to as "(2-1)$^{th}$ light emission element") LD2-1 and a (2-1)$^{th}$ pixel circuit PC2-1 electrically connected to the (2-1)$^{th}$ light emission element LD2-1. The (2-2)$^{th}$ pixel PX2-2 may include a second second light emission element (hereinafter, will be referred to as "(2-2)$^{th}$ light emission element") LD2-2 and a (2-2)$^{th}$ pixel circuit PC2-2 electrically connected to the (2-2)$^{th}$ light emission element LD2-2.

The (2-1)$^{th}$ light emission element LD2-1 may be disposed in the (2-1)$^{th}$ area DP-A2-1, and the (2-1)$^{th}$ pixel circuit PC2-1 may be disposed in the (2-2)$^{th}$ area DP-A2-2.

The (2-2)$^{th}$ light emission element LD2-2 and the (2-2)$^{th}$ pixel circuit PC2-2 may be arranged in the (2-2)$^{th}$ area DP-A2-2.

To increase light transmittance of the (2-1)$^{th}$ area DP-A2-1, the (2-1)$^{th}$ pixel circuit PC2-1 is disposed in the (2-1)$^{th}$ area DP-A2-1 instead of the (2-2)$^{th}$ area DP-A2-2. As the light blocking structure such as a transistor is removed, the occupancy of a transmittance area increases, and as a result, the transmittance of the (2-1)$^{th}$ area DP-A2-1 may be improved. Alternatively, the (2-1)$^{th}$ pixel circuit PC2-1 may be disposed in the first area DP-A1 (see FIG. 5) and the non-display area DP-NA (see FIG. 5) other than the (2-2)$^{th}$ area DP-A2-2.

FIG. 8 illustratively illustrates two types of (2-1)$^{th}$ pixels PX2-1. The one of the two types of (2-1)$^{th}$ pixels PX2-1 may include the (2-1)$^{th}$ light emission element LD2-1 spaced apart from the (2-1)$^{th}$ pixel circuit PC2-1 in the first direction DR1. The other of the two types of (2-1)$^{th}$ pixels PX2-1 includes the (2-1)$^{th}$ light emission element LD2-1 spaced apart from the (2-1)$^{th}$ pixel circuit PC2-1 in the second direction DR2. Although not illustrated, the (2-1)$^{th}$ pixel PX2-1 disposed on a right side of the (2-1)$^{th}$ area DP-A2-1 may also have an arrangement relationship of the (2-1)$^{th}$ light emission element LD2-1 and the (2-1)$^{th}$ pixel circuit PC2-1, which is similar to the (2-1)$^{th}$ pixel PX2-1 disposed on a left side of the (2-1)$^{th}$ area DP-A2-1. Further, the (2-1)$^{th}$ pixel PX2-1 disposed on a lower side of the (2-1)$^{th}$ area DP-A2-1 may also have an arrangement relationship of the (2-1)$^{th}$ light emission element LD2-1 and the (2-1)$^{th}$ pixel circuit PC2-1, which is similar to the (2-1)$^{th}$ pixel PX2-1 disposed on an upper side of the (2-1)$^{th}$ area DP-A2-1.

Figure 9:
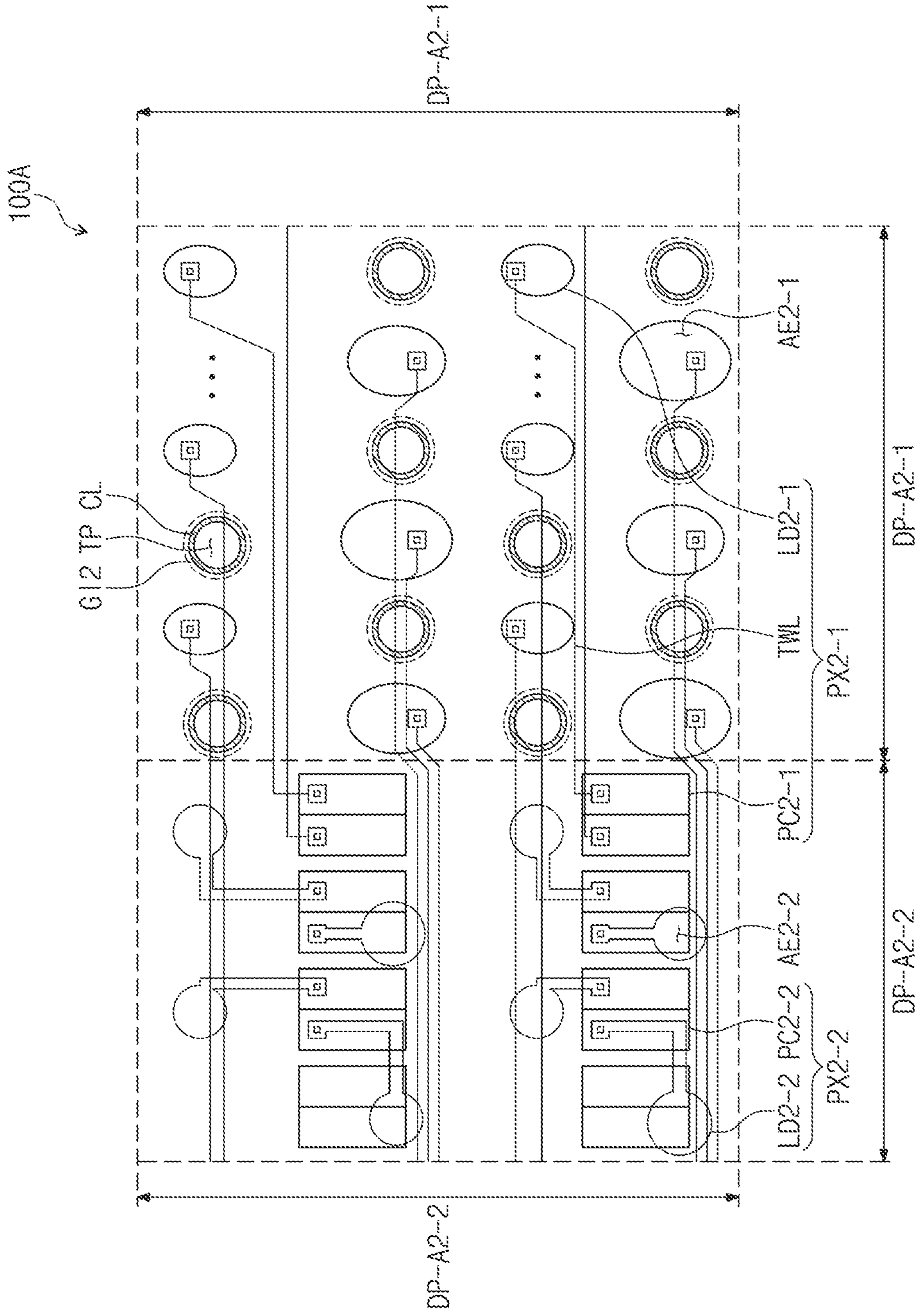
FIG. 9 is an enlarged plan view of part of the display area of FIG. 8 according to an embodiment of the present disclosure.

FIG. 9 is an enlarged plan view of part of the display area 100A of FIG. 8.

FIG. 9 illustrates anodes AE2-1 and AE2-2 of the light emission elements, representing the (2-1)$^{th}$ light emission element LD2-1 and the (2-2)$^{th}$ light emission element LD2-2. To improve the transmittance of the (2-1)$^{th}$ area DP-A2-1, a resolution of the (2-1)$^{th}$ area DP-A2-1 may be less than that of the first area DP-A1 (see FIG. 5).

A transmissive area TP may be disposed in a portion of an area of the (2-1)$^{th}$ area DP-A2-1, in which the (2-1)$^{th}$ light emission element LD2-1 is not disposed. The transmissive area TP may be an area of the (2-1)$^{th}$ area DP-A2-1, which overlaps a first groove GV1 (see FIG. 10), which will be described below, in a plan view. The transmissive area TP may have a transmittance higher than that of an area of the (2-1)$^{th}$ area DP-A2-1, in which the (2-1)$^{th}$ light emission element LD2-1 is disposed. FIG. 9 illustrates an embodiment where the transmissive area TP is disposed between the (2-1)$^{th}$ light emission elements LD2-1, but the present disclosure is not limited thereto. Alternatively, the size, the shape, and the arrangement of the transmissive area TP may be changed or modified based on a desired or predetermined transmittance of the (2-1)$^{th}$ area DP-A2-1.

An insulating pattern GI2 may be disposed adjacent to the transmissive area TP in a plan view. The insulating pattern GI2 may be disposed adjacent to a boundary of the transmissive area TP. A portion of the insulating pattern Gi2 may overlap the transmissive area TP in a plan view, and the other thereof may be disposed outside the transmissive area TP. The insulating pattern GI2 may have a ring shape surrounding the boundary of the transmissive area TP. However, the shape of the insulating pattern GI2 in a plan view is not limited thereto, and the insulating pattern GI2 may have various shapes such as a hollow quadrangular shape surrounding the boundary of the transmissive area TP.

A groove organic pattern CL may be disposed adjacent to the transmissive area TP in a plan view. The groove organic pattern CL may be disposed adjacent to the boundary of the transmissive area TP. A portion of the groove organic pattern CL may overlap the transmissive area TP in a plan view, and the other thereof may be disposed outside the transmissive area TP. The groove organic pattern CL may have a ring shape surrounding the boundary of the transmissive area TP. An inner surface of the groove organic pattern CL in a plan view may be disposed closer to a center of the transmissive area TP than an inner surface of the insulating pattern GI2 in a plan view.

The (2-1)$^{th}$ light emission element LD2-1 may be electrically connected to the (2-1)$^{th}$ pixel circuit PC2-1 through a connection wire TWL. The connection wire TWL may overlap the (2-1)$^{th}$ area DP-A2-1 and the (2-2)$^{th}$ area DP-A2-2. The connection wire TWL may cross a boundary between the (2-1)$^{th}$ area DP-A2-1 and the (2-2)$^{th}$ area DP-A2-2. The connection wire TWL may overlap the transmissive area TP. At least a portion of the connection wire TWL may include a transparent conductive material.

The (2-1)$^{th}$ anode AE2-1 of the (2-1)$^{th}$ light emission element LD2-1 may have an elliptic shape in a plan view. The (2-1)$^{th}$ anode AE2-1 may secure a light emitting area, and at the same time, secure a connection area of the connection wire TWL.

Figure 10:
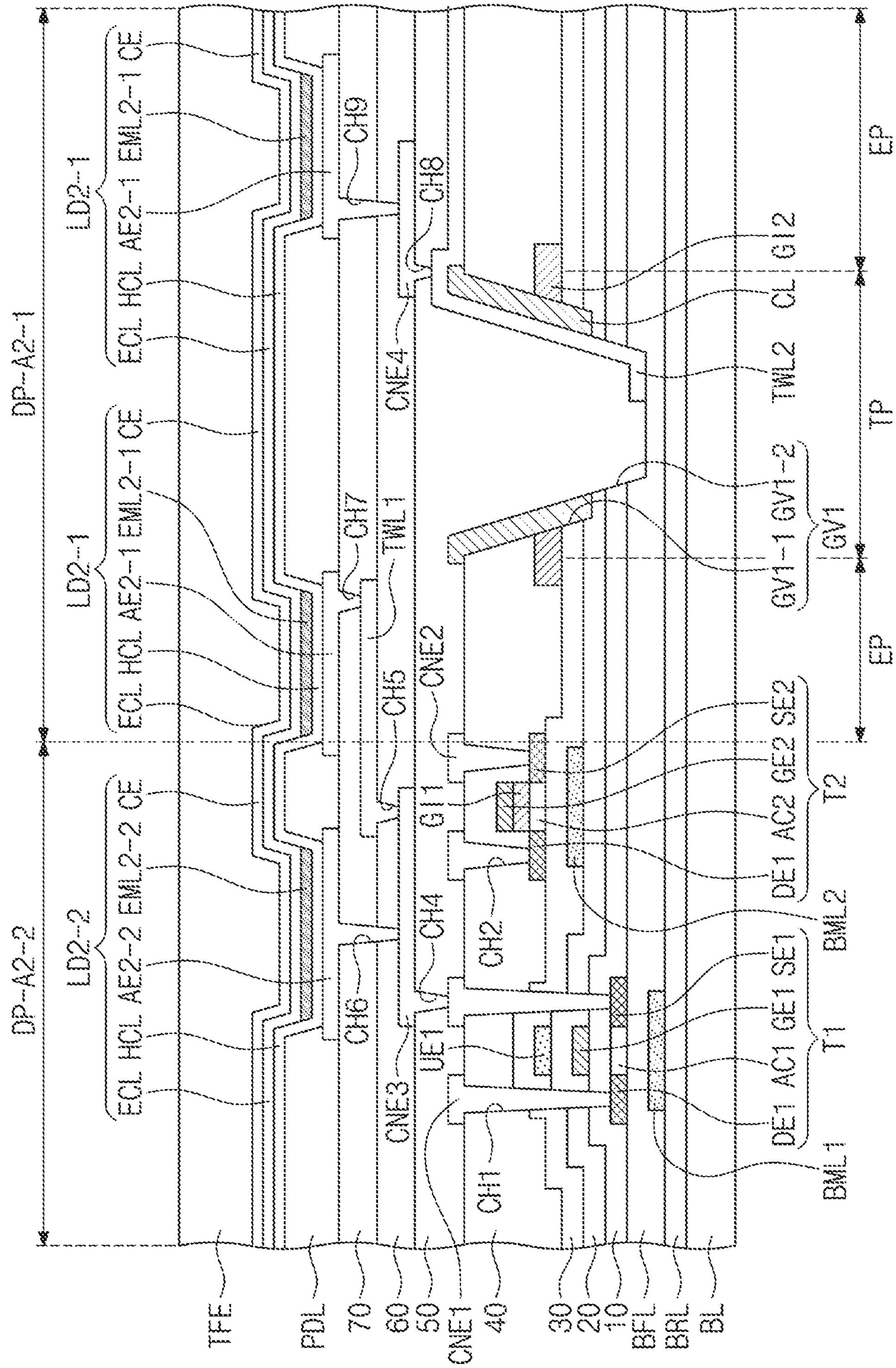
FIG. 10 is a cross-sectional view corresponding to a $(2\text{-}1)^{th}$ area and a $(2\text{-}2)^{th}$ area according to an embodiment of the present disclosure.

FIG. 10 is a cross-sectional view corresponding to the (2-1)$^{th}$ area DP-A2-1 and the (2-2)$^{th}$ area DP-A2-2 according to an embodiment of the present disclosure.

A laminated structure of the first transistor T1, the second transistor T2, the base layer BL, the inorganic layers BRL and BFL, and the first to seventh insulating layers 10 to 70 of FIG. 10 may be partially the same as a laminated structure of the first transistor T1, the second transistor T2, the base layer BL, the inorganic layers BRL and BFL, and the first to seventh insulating layers 10 to 70 of FIG. 7. Accordingly, any repetitive detailed description of the same elements as those described above will be omitted or simplified.

The (2-1)$^{th}$ area DP-A2-1 may include the transmissive area TP and a light emission area EP. The transmissive area TP may overlap the first groove GV1, which will be described below. The light emission area EP may be adjacent to the transmissive area TP and overlap the (2-1)$^{th}$ light emission element LD2-1.

The first groove GV1 may include a (1-1)$^{th}$ groove GV1-1 and a (1-2)$^{th}$ groove GV1-2. The (1-1)$^{th}$ groove GV1-1 may be defined by some of the plurality of insulating layers 10 to 70 overlapping the (2-1)$^{th}$ area DP-A2-1. Inner surfaces of the plurality of insulating layers 20, 30, and 40 defining the (1-1)$^{th}$ groove GV1-1 may have a predetermined slope on a cross section.

The (1-1)$^{th}$ groove GV1-1 may be defined through the fourth insulating layer 40 and the third insulating layer 30 and extend to an upper portion of the second insulating layer 20. However, a depth of the (1-1)$^{th}$ groove GV1-1 is not limited thereto and may be variously changed as long as the (1-1)$^{th}$ groove GV1-1 is not in contact with the inorganic layers BRL and BFL. In an alternative embodiment, for example, the (1-1)$^{th}$ groove GV1-1 may be defined through the fourth insulating layer 40, the third insulating layer 30, and the second insulating layer 20 and extend to an upper portion of the first insulating layer 10.

The insulating pattern GI2 may be disposed on one insulating layer among the plurality of insulating layers 10 to 70. The insulating pattern GI2 may be disposed on the third insulating layer 30. The insulating pattern GI2 may be disposed adjacent to inner surfaces of the insulating layers defining the $(1-1)^{th}$ groove GV1-1. The insulating pattern GI2 may be covered by the fourth insulating layer 40. Unlike the plurality of insulating layers 10 to 70 that entirely overlap the second area DP-A2, the insulating pattern GI2 may overlap only a portion of the second area DP-A2. The insulating pattern GI2 may overlap only a portion of the second area DP-A2, which is adjacent to the first groove GV1.

The inner surface of the insulating pattern GI2, which is adjacent to the $(1-1)^{th}$ groove GV1-1, together with the inner surfaces of the insulating layers 20, 30, and 40 defining the $(1-1)^{th}$ groove GV1-1, may define the $(1-1)^{th}$ groove GV1-1. The insulating pattern GI2 and the $(1-1)^{th}$ groove GV1-1 may not be spaced apart from each other. The inner surface of the insulating pattern GI2 may be aligned with the inner surfaces of the plurality of insulating layers 20, 30, and 40 defining the $(1-1)^{th}$ groove GV1-1 on cross section. The insulating pattern GI2 may include a same material as the gate insulating pattern GI1.

The $(1-2)^{th}$ groove GV1-2 may be defined by some of the plurality of insulating layers 10 to 70 overlapping the $(2-1)^{th}$ area DP-A2-1. The $(1-2)^{th}$ groove GV1-2 may extend from the $(1-1)^{th}$ groove GV1-1. Side surfaces of the plurality of insulating layers 10 and 20 defining the $(1-2)^{th}$ groove GV1-2 and a side surface of the buffer layer BFL may have a predetermined slope on cross section.

The $(1-2)^{th}$ groove GV1-2 may be defined through the remaining insulating layers 10 and 20 that the $(1-1)^{th}$ groove GV1-1 does not pass through and may extend to an upper portion of the buffer layer BFL among the inorganic layers BRL and BFL. However, a depth of the $(1-2)^{th}$ groove GV1-2 is not limited thereto and may be variously changed as long as the base layer BL is not exposed. In an alternative embodiment, for example, the $(1-2)^{th}$ groove GV1-2 may be defined through the first insulating layer 10, the second insulating layer 20, and the buffer layer BFL and may extend to an upper portion of the barrier layer BRL.

The inorganic layers BRL and BFL may remain below the $(1-2)^{th}$ groove GV1-2. The inorganic layers BRL and BFL remaining below the $(1-2)^{th}$ groove GV1-2 may prevent moisture from penetrating into the $(2-1)^{th}$ light emission element LD2-1 present in the $(2-1)^{th}$ area DP-A2-1 or prevent internal/external impact from being transferred to the $(2-1)^{th}$ light emission element LD2-1.

The groove organic pattern CL may cover the inner surfaces of the plurality of insulating layers 20, 30, and 40 defining the $(1-1)^{th}$ groove GV1-1. The groove organic pattern CL may include the same organic material as the organic pattern OIP of FIG. 7. The groove organic pattern CL may cover a step (or a stepped structure) defined between the inner surfaces of the plurality of insulating layers 20, 30, and 40 defining the $(1-1)^{th}$ groove GV1-1 and inner surfaces of the plurality of insulating layers 10 and 20 defining the $(1-2)^{th}$ groove GV1-2 and the buffer layer BFL.

The groove organic pattern CL may be aligned with the $(1-2)^{th}$ groove GV1-2 on cross section. That is, the groove organic pattern CL covers the inner surfaces of the plurality of insulating layers 20, 30, and 40 defining the $(1-1)^{th}$ groove GV1-1 so that the groove organic pattern CL and the $(1-2)^{th}$ groove GV1-2 may be smoothly connected. Accordingly, a second connection wire TWL2, which will be described below, may be stably disposed on the groove organic pattern CL, the plurality of insulating layers 10 and 20 defining the $(1-2)^{th}$ groove GV1-2, and the inner surface of the buffer layer BFL (hereinafter, referred to as an inner surface of the $(1-2)^{th}$ groove GV1-2).

The second connection wire TWL2 may be disposed on the inner surface of the $(1-2)^{th}$ groove GV1-2 and the groove organic pattern CL. The second connection wire TWL2 may be one of the connection wires TWL crossing the transmissive area TP in FIG. 9. The second connection wire TWL2 may connect the $(2-1)^{th}$ light emission element LD2-1 disposed on the light emission area EP of the $(2-1)^{th}$ area DP-A2-1 and the $(2-2)^{th}$ pixel circuit PC2-2 disposed on the $(2-2)^{th}$ area DP-A2-2 (see FIG. 9).

The fifth insulating layer 50 may be disposed on the fourth insulating layer 40. The fifth insulating layer 50 may remove steps formed in lower insulating layers and provide a flat upper surface. That is, the fifth insulating layer 50 may be in contact with an exposed upper surface of the buffer layer BFL, an inclined surface of the $(1-2)^{th}$ groove GV1-2, an inclined surface of the groove organic pattern CL, and an inclined surface of the second connection wire TWL2.

The third connection electrode CNE3 may be disposed on the fifth insulating layer 50. The third connection electrode CNE3 may be connected to the first connection electrode CNE1 through the fourth through-hole CH4 defined through the fifth insulating layer 50.

A fourth connection electrode CNE4 may be disposed on the fifth insulating layer 50. The fourth connection electrode CNE4 may overlap the (2-1)th area DP-A2-1. The fourth connection electrode CNE4 may be connected to the second connection wire TWL2 through an eighth through-hole CH8 defined through the fifth insulating layer 50.

A first connection wire TWL1 may be disposed on the sixth insulating layer 60. The first connection wire TWL1 may overlap the $(2-2)^{th}$ area DP-A2-2 and the $(2-1)^{th}$ area DP-A2-1. The first connection wire TWL1 may cross a boundary between the $(2-1)^{th}$ area DP-A2-1 and the $(2-2)^{th}$ area DP-A2-2 and connect the $(2-1)^{th}$ light emission element LD2-1 disposed in the $(2-1)^{th}$ area DP-A2-1 and the transistors T1 and T2 disposed in the $(2-2)^{th}$ area DP-A2-2. The first connection wire TWL1 may be one of the connection wires TWL crossing the transmissive area TP illustrated in FIG. 9. At least a portion of the first connection wire TWL1 may include a transparent conductive material.

The $(2-2)^{th}$ anode AE2-2 of the $(2-2)^{th}$ light emission element LD2-2 may be disposed on the seventh insulating layer 70. The $(2-2)^{th}$ anode AE2-2 may be connected to the third connection electrode CNE3 through the sixth through-hole CH6 defined through the sixth insulating layer 60 and the seventh insulating layer 70. The $(2-2)^{th}$ light emission element LD2-2 may include the $(2-1)^{th}$ anode AE2-1, the $(2-1)^{th}$ light emission element LD2-1, and the cathode CE. The $(2-2)^{th}$ light emission element LD2-2 may include the hole control layer HCL and the electron control layer ECL. The cathode CE may be commonly provided to overlap the $(2-1)^{th}$ light emission element LD2-1 and the $(2-2)^{th}$ light emission element LD2-2.

The $(2-1)^{th}$ area DP-A2-1 may include the transmissive area TP and the light emission area EP. The transmissive area TP may overlap the first groove GV1. The light emission area EP may overlap the $(2-1)^{th}$ light emission element LD2-1.

The $(2-1)^{th}$ anode AE2-1 of the $(2-1)^{th}$ light emission element LD2-1 may be disposed on the seventh insulating layer 70. The $(2-1)^{th}$ anode AE2-1 may be connected to the transistors T1 and T2 of the $(2-2)^{th}$ area DP-A2-2 through the connection wires TWL1 and TWL2.

The $(2-1)^{th}$ anode AE2-1 of the $(2-1)^{th}$ light emission element LD2-1 disposed on a left side of the $(2-1)^{th}$ area DP-A2-1 may be connected to the first connection wire TWL1 through a seventh through-hole CH7 defined through the seventh insulating layer 70. The first connection wire TWL1 may be connected to the third connection electrode CNE3 by a fifth through-hole CH5 defined through the sixth insulating layer 60.

The (2-1)$^{th}$ anode AE2-1 of the (2-1)$^{th}$ light emission element LD2-1 disposed on a right side of the (2-1)$^{th}$ area DP-A2-1 may be connected to the fourth connection electrode CNE4 by a ninth through-hole CH9 defined through the sixth insulating layer 60 and the seventh insulating layer 70. The fourth connection electrode CNE4 may be connected to the second connection wire TWL2 by the eighth through-hole CH8 defined through the fifth insulating layer 50.

Figure 11:
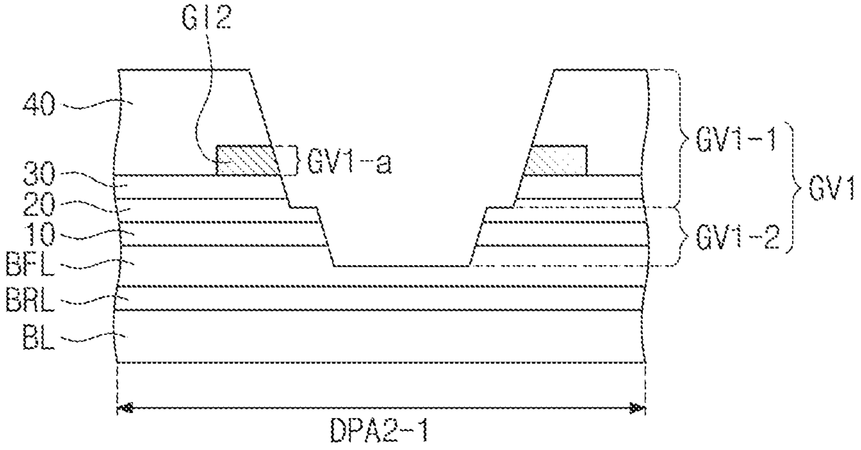
FIG. 11 is a cross-sectional view illustrating a first groove of the $(2\text{-}1)^{th}$ area of FIG. 10 according to an embodiment of the present disclosure.

FIG. 11 is a cross-sectional view illustrating a first groove of the (2-1)$^{th}$ area of FIG. 10.

Referring to FIG. 11, a step may be present in a boundary between the (1-1)$^{th}$ groove GV1-1 and the (1-2)$^{th}$ groove GV1-2. Due to the step, when the connection wire is disposed on the first groove GV1, the connection wire may be disconnected. Accordingly, as illustrated in FIG. 10, the groove organic pattern CL (see FIG. 10) that is an organic film covering the inner surface defining the (1-1)$^{th}$ groove GV1-1 may be disposed to smooth the surface thereof.

A first area GV1-*a* of the (1-1)$^{th}$ groove GV1-1 that is a portion of the (1-1)$^{th}$ groove GV1-1 may be defined by the insulating pattern GI2. That is, the first area GV1-*a* of the (1-1)$^{th}$ groove GV1-1 may be defined by the inner surface of the insulating pattern GI2. The insulating pattern GI2 may be disposed between the plurality of insulating layers 20, 30, and 40 defining the (1-1)$^{th}$ groove GV1-1. The inner surface of the insulating pattern GI2 may be aligned with the inner surfaces of the plurality of insulating layers 20, 30, and 40 on cross section.

Figure 12:
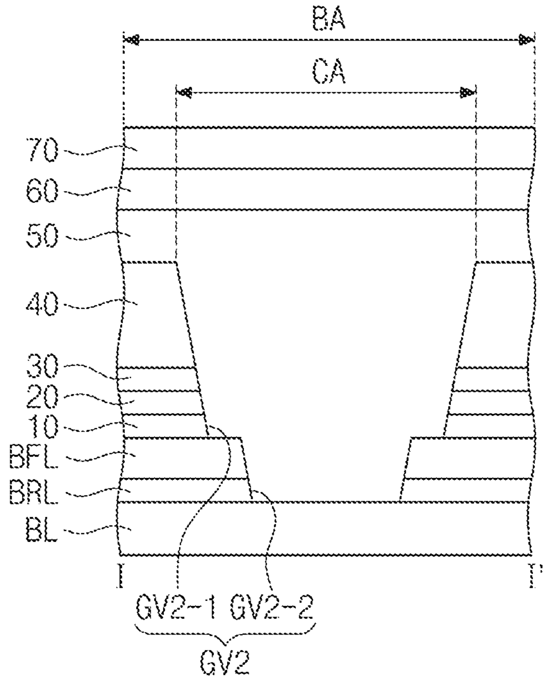
FIG. 12 is a cross-sectional view along line I-I' of FIG. 5 according to an embodiment of the present disclosure.

FIG. 12 is a cross-sectional view along line I-I' of FIG. 5.

Referring to FIG. 12, a cross section of the bending area BA may be identified. In the bending area BA, the barrier layer BRL, the buffer layer BFL, and the first to seventh insulating layers 10 to 70 may be sequentially arranged from an upper surface of the base layer BL.

The bending area BA may include the curvature area CA. The curvature area CA may correspond to a second groove GV2. The second groove GV2 may include a first second groove (hereinafter, will be referred to as "(2-1)$^{th}$ groove") GV2-1 and a second second groove (hereinafter, will be referred to as "(2-2)$^{th}$ groove") GV2-2.

The (2-1)$^{th}$ groove GV2-1 overlapping the bending area BA may be defined by the first to fourth insulating layers 10 to 40. The (2-1)$^{th}$ groove GV2-1 may be defined in the curvature area CA. The (2-1)$^{th}$ groove GV2-1 may defined through the first to fourth insulating layers 10 to 40 overlapping the curvature area CA. The (2-1)$^{th}$ groove GV2-1 may partially expose, from the first to fourth insulating layers 10 to 40, an upper surface of the uppermost inorganic layer among the inorganic layers constituting the barrier layer BRL and the buffer layer BFL. Side surfaces of the insulating layers 10 to 40 defining the (2-1)$^{th}$ groove GV2-1 may have a predetermined slope on a cross section.

The (2-2)$^{th}$ groove GV2-2 overlapping the bending area BA may be defined by the barrier layer BRL and the buffer layer BFL. The (2-2)$^{th}$ groove GV2-2 may be defined in the curvature area CA. The inorganic layers BRL and BRL arranged below the first semiconductor pattern OSP1 (see FIG. 7) may overlap the first area DP-A1 and the second area DP-A2 and extend to the bending area BA.

The (2-2)$^{th}$ groove GV2-2 may be defined through the barrier layer BRL and the buffer layer BFL overlapping the curvature area CA. The (2-2)$^{th}$ groove GV2-2 may partially expose the upper surface of the base layer BL from the barrier layer BRL and the buffer layer BFL. Side surfaces of the barrier layer BRL and the buffer layer BFL defining the (2-2)$^{th}$ groove GV2-2 may have a predetermined slope on a cross section. A width of the base layer BL exposed by the (2-2)$^{th}$ groove GV2-2 may be less than a width of the curvature area CA.

The fifth insulating layer 50 that is an organic layer may be disposed inside the (2-1)$^{th}$ groove GV2-1 and the (2-2)$^{th}$ groove GV2-2. The fifth insulating layer 50 may remove steps formed in lower insulating layers and provide a flat upper surface. The fifth insulating layer 50 may be in contact with the upper surface of the base layer BL, an inclined surface of the (2-2)$^{th}$ groove GV2-2, and an inclined surface of the (2-1)$^{th}$ groove GV2-1. The inorganic layers BRL and BFL are etched in the bending area BA, the fifth insulating layer 50 that is an organic layer is disposed in the bending area BA, and thus flexibility of the bending area BA may be improved.

The sixth insulating layer 60 may be disposed on the fifth insulating layer 50. The seventh insulating layer 70 may be disposed on the sixth insulating layer 60. Each of the fifth to seventh insulating layers 50, 60, and 70 may be an organic layer.

Figure 13:
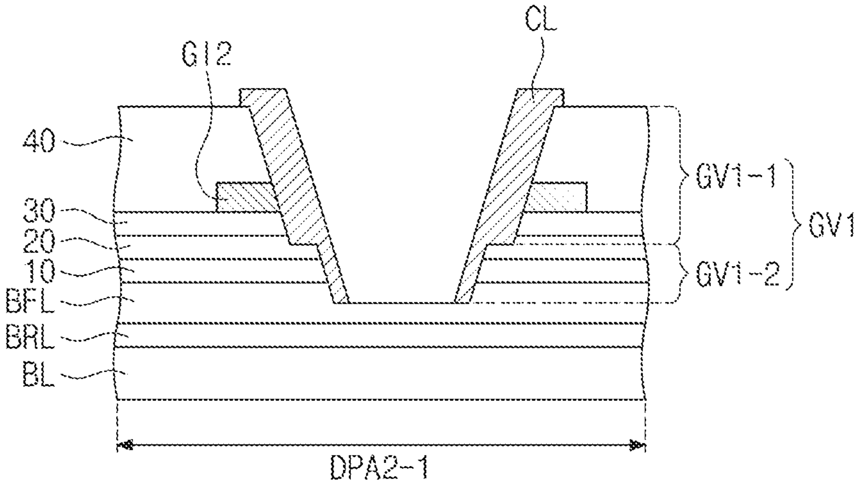
FIG. 13 is a cross-sectional view illustrating a first groove of the $(2\text{-}1)^{th}$ area of FIG. 10 according to an alternative embodiment of the present disclosure.

FIG. 13 is a cross-sectional view illustrating the first groove GV1 of the (2-1)$^{th}$ area DP-A2-1 of FIG. 10 according to an alternative embodiment of the present disclosure.

A cross section of the (2-1)$^{th}$ area DP-A2-1 illustrated in FIG. 13 is substantially the same as a cross section of the (2-1)$^{th}$ area DP-A2-1 illustrated in FIG. 11 except for the organic pattern OIP, and thus any repetitive detailed description of the same components as those described above will be omitted or simplified.

In an embodiment, the groove organic pattern CL may cover the inclined surfaces of the (1-1)$^{th}$ groove GV1-1 and the (1-2)$^{th}$ groove GV1-2. That is, the groove organic pattern CL may cover the inner surfaces of the plurality of insulating layers 20, 30, and 40 defining the (1-1)$^{th}$ groove GV1-1 and the inner surfaces of the plurality of insulating layers 10 and 20 defining the (1-2)$^{th}$ groove GV1-2 and the buffer layer BFL. The groove organic pattern CL may include a same organic material as the organic pattern OIP of FIG. 7.

The groove organic pattern CL may remove steps formed on the inclined surface of the first groove GV1 and surface roughness and provide a flat upper surface. The groove organic pattern CL may overlap the curvature area CA. Due to the flat upper surface of the groove organic pattern CL, the second connection wire TWL2 (see FIG. 10) may be disposed on the groove organic pattern CL without disconnection.

FIGS. 14 to 28 are cross-sectional views illustrating the method of manufacturing the display device DD according to an embodiment of the present disclosure. FIGS. 14 to 28 illustrate comparisons of a portion of the first area DP-A1 of FIG. 7, the (2-1)$^{th}$ area DP-A2-1 of FIG. 10, and the bending area BA of FIG. 12. Hereinafter, any repetitive detailed description of the same components as the components described with reference to FIGS. 1 to 13 will be omitted or simplified.

Figure 14:
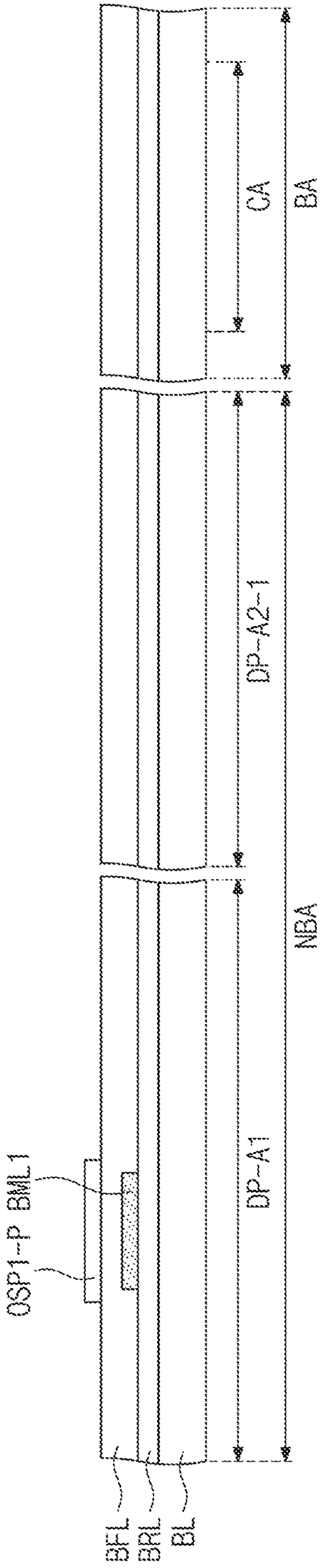
FIGS. 14 to 28 are cross-sectional views illustrating a method of manufacturing a display device according to an embodiment of the present disclosure.

Referring to FIG. 14, the base layer BL may overlap the non-bending area NBA including the first area DP-A1 and the (2-1)$^{th}$ area DP-A2-1 and the bending area BA including the curvature area CA. The barrier layer BRL that is an inorganic layer may be formed on the base layer BL.

Inorganic layers may be formed by depositing, coating, or printing an inorganic material. A silicon oxide layer and a silicon nitride layer may be sequentially formed to form the barrier layer BRL. The first rear surface metal pattern BML1 may be formed on the barrier layer BRL. The first rear surface metal pattern BML1 may overlap a preliminary first semiconductor pattern OSP1-P. A silicon oxide layer and a silicon nitride layer may be sequentially formed on the barrier layer BRL to form the buffer layer BFL.

The preliminary first semiconductor pattern OSP1-P may be formed on the buffer layer BFL. The semiconductor layer may be formed and then patterned to form the preliminary first semiconductor pattern OSP1-P. The semiconductor layer may be crystallized before/after patterning. Although not separately illustrated, the preliminary first semiconductor pattern OSP1-P may be doped.

Figure 15:
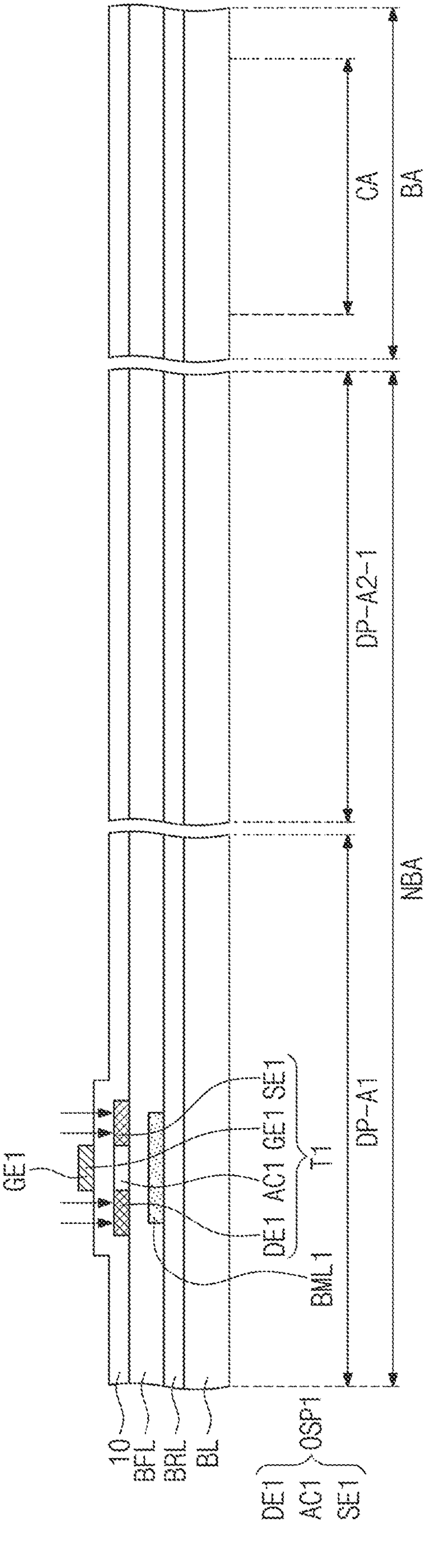

Referring to FIG. 15, the first insulating layer 10 may be formed on the inorganic layers BRL and BFL. The first insulating layer 10 may be formed by depositing, coating, or printing. Insulating layers formed on the first insulating layer 10 may be also formed by depositing, coating, or printing.

The first gate GE1 may be formed on the first insulating layer 10. A conductive layer may be formed on the first insulating layer 10 and then be patterned to form the first gate GE1. The first electrode E1 of the capacitor CST of FIG. 7 may be formed through a same process as that of the first gate GE1.

Thereafter, the preliminary first semiconductor pattern OSP1-P may be doped using the first gate GE1 as a mask. An area of the preliminary first semiconductor pattern OSP1-P, which overlaps the first gate GE1, may not be doped and become the first active area AC1. An area of the preliminary first semiconductor pattern OSP1-P, which does not overlap the first gate GE1, may be doped and become the first drain area DE1 or the first source area SE1. Accordingly, the first semiconductor pattern OSP1 may be formed. The first transistor T1 may include the first semiconductor pattern OSP1 and the first gate GE1.

Figure 16:
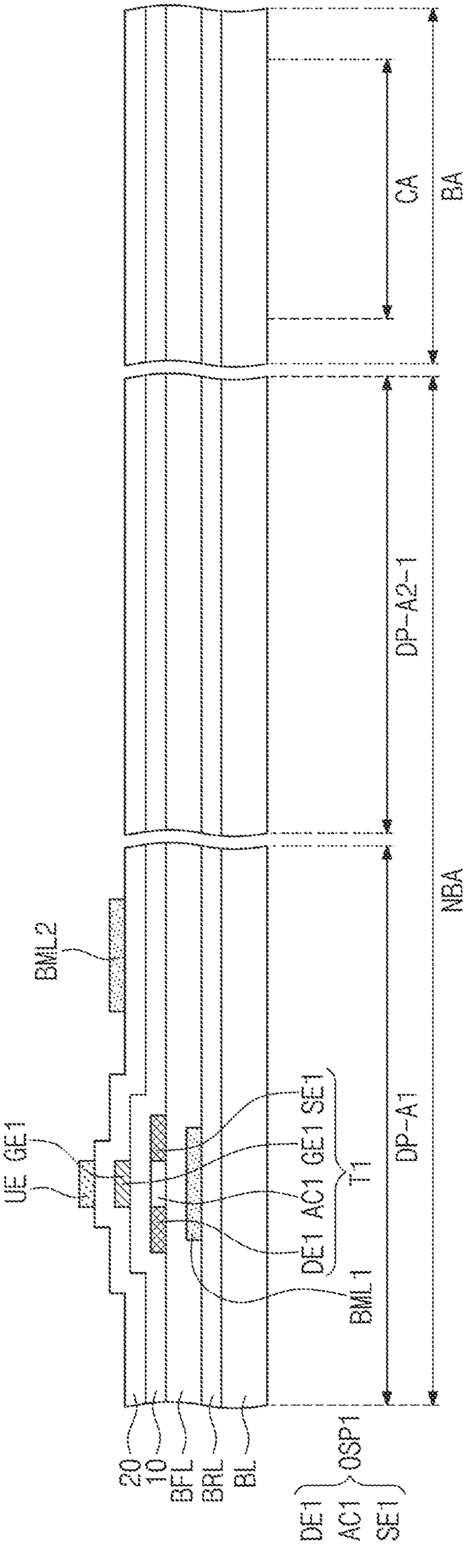

Referring to FIG. 16, the second insulating layer 20 may be formed on the first insulating layer 10 to cover the first gate GE1. The upper electrode UE overlapping the first semiconductor pattern OSP1 may be formed on the second insulating layer 20. The second rear surface metal pattern BML2, which does not overlap the first semiconductor pattern OSP1, may be formed on the second insulating layer 20 of the first area DP-A1.

Figure 17:
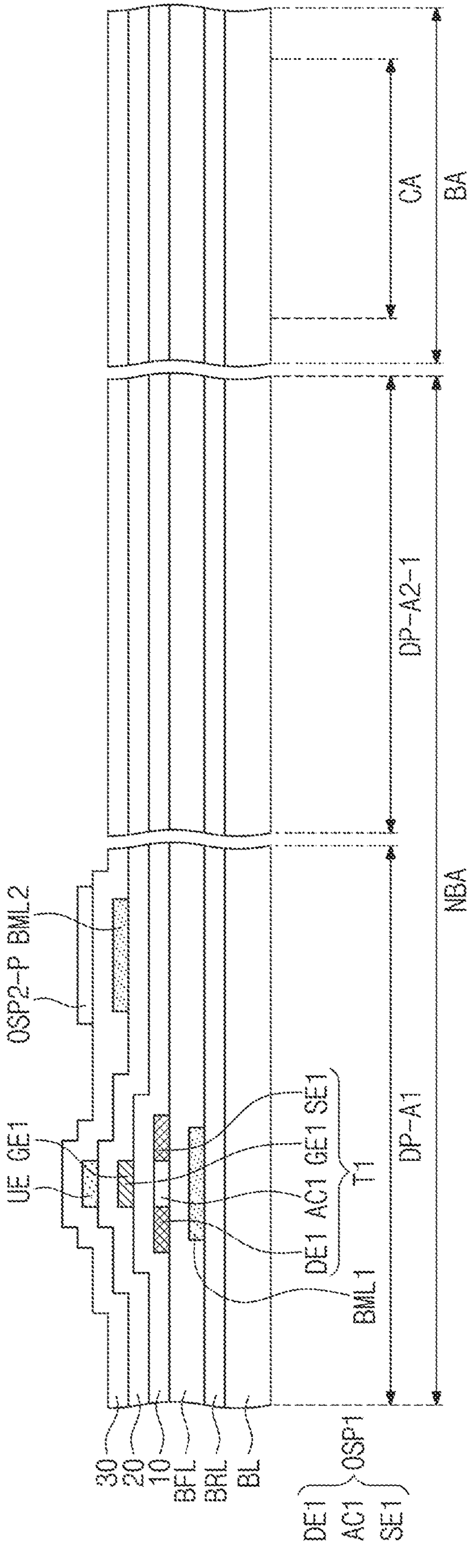

Referring to FIG. 17, the third insulating layer 30, which covers the upper electrode UE and the second rear surface metal pattern BML2, may be formed on the second insulating layer 20. A preliminary second semiconductor pattern OSP2-P, which does not overlap the first transistor T1, may be formed on the third insulating layer 30 of the first area DP-A1. The semiconductor layer may be formed and then patterned to form the preliminary second semiconductor pattern OSP2-P. The semiconductor layer may be crystallized before/after patterning.

Figure 18:
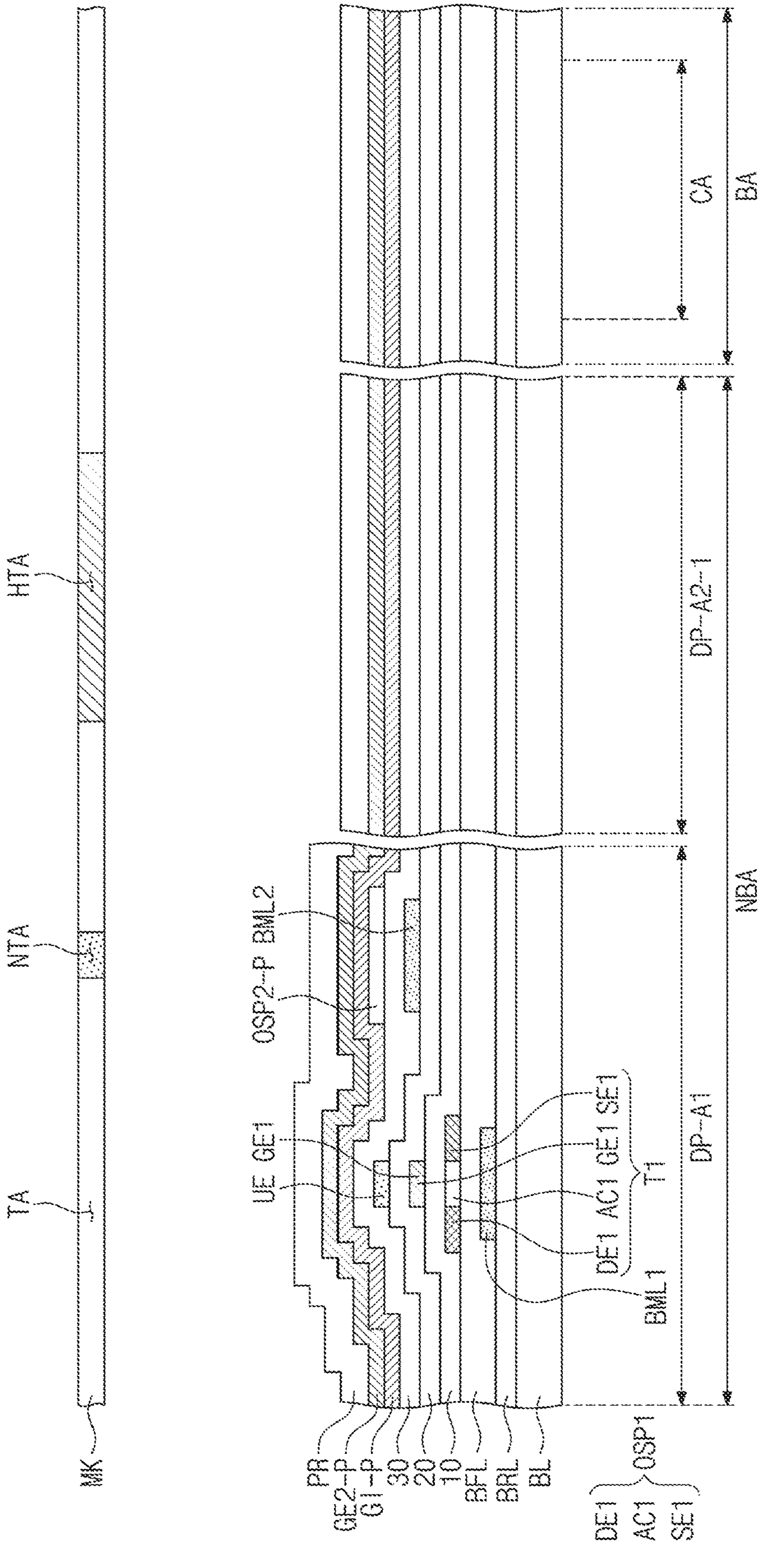

Referring to FIG. 18, a preliminary gate insulating pattern layer GI-P may be formed on the third insulating layer 30. A preliminary second gate layer GE2-P may be formed on the preliminary gate insulating pattern layer GI-P. A photo-resist layer PR may be formed on the preliminary second gate layer GE2-P. The preliminary gate insulating pattern layer GI-P, the preliminary second gate layer GE2-P, and the photo-resist layer PR may overlap the first area DP-A1 and the $(2\text{-}1)^{th}$ area DP-A2-1. Exposure may be performed on the photo-resist layer PR using a mask MK including a transmissive area TA, a non-transmissive area NTA, and a semi-transmissive area HTA.

Figure 19:
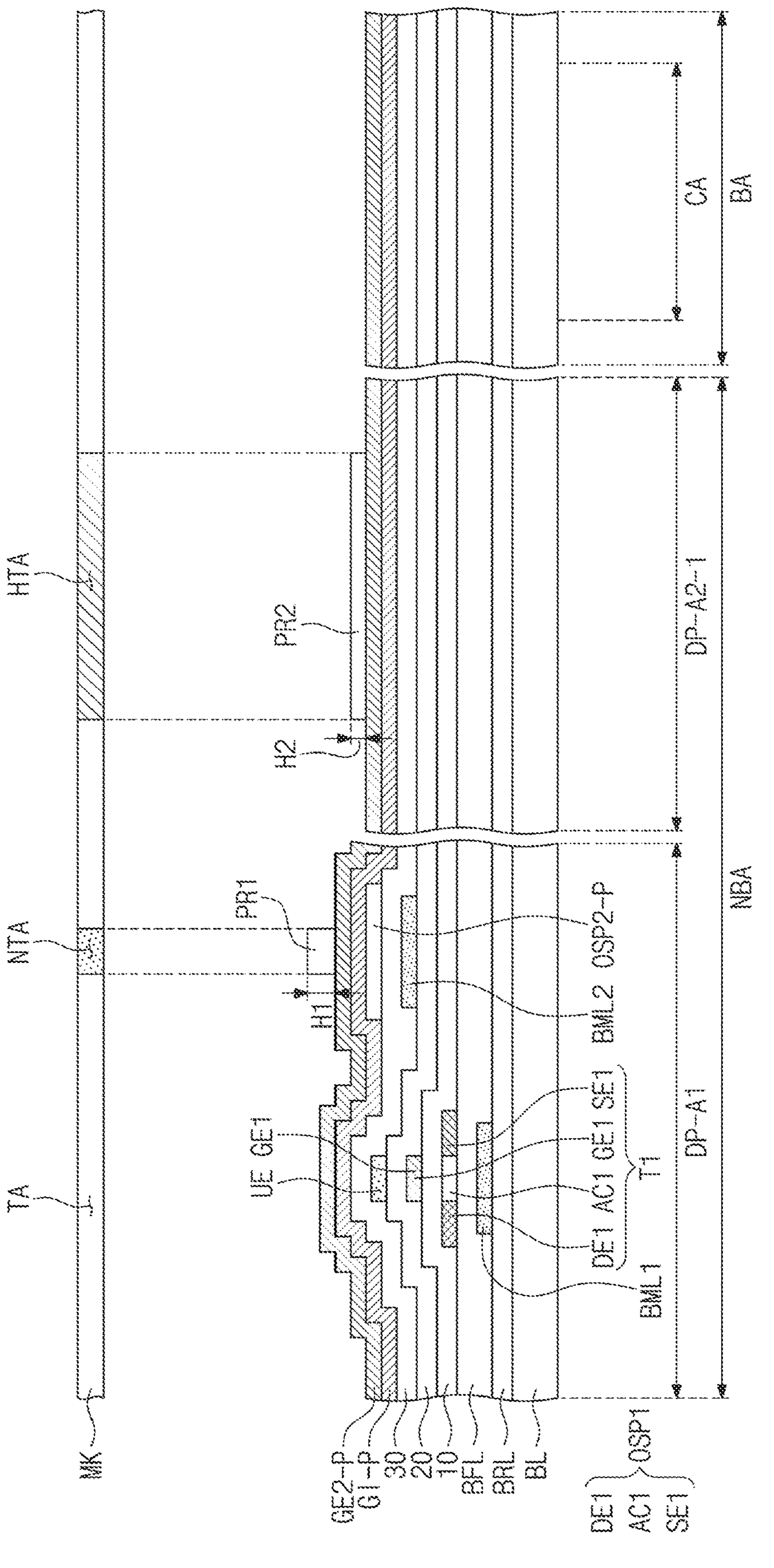

Referring to FIG. 19, after an exposure process and a development process are performed, a first photo-resist layer PR1 corresponding to the non-transmissive area NTA and a second photo-resist layer PR2 corresponding to the semi-transmissive area HTA may be formed. In an embodiment where a positive-type photo-resist is used, a portion receiving light (a portion corresponding to the transmissive area TA) may be dissolved in a developing solution. However, the photo-resist is not limited to the positive-type photo-resist, and alternatively, a negative-type photo-resist in which a portion not receiving light (a portion corresponding to the non-transmissive area NTA) is dissolved in the developing solution may be used. However, in such an embodiment, positions of the transmissive area TA and the non-transmissive area NTA of the mask MK may be interchanged.

The photo-resist layer PR corresponding to the transmissive area TA may receive light and be thus dissolved and removed by the developing solution. The photo-resist layer PR corresponding to the non-transmissive area NTA may not receive light and may not be thus dissolved and removed by the developing solution. Here, the remaining photo-resist layer PR may be the first photo-resist layer PR1 having a first thickness H1.

The photo-resist layer PR corresponding to the semi-transmissive area HTA receives less light than the transmissive area TA, and thus a portion of the photo-resist layer PR may be dissolved and removed. The remaining photo-resist layer PR may be the second photo-resist layer PR2 having a second thickness H2. The first thickness H1 of the first photo-resist layer PR1 may be greater than the second thickness H2 of the second photo-resist layer PR2. The first thickness H1 of the first photo-resist layer PR1 may be about two times the second thickness H2 of the second photo-resist layer PR2.

Figure 20:
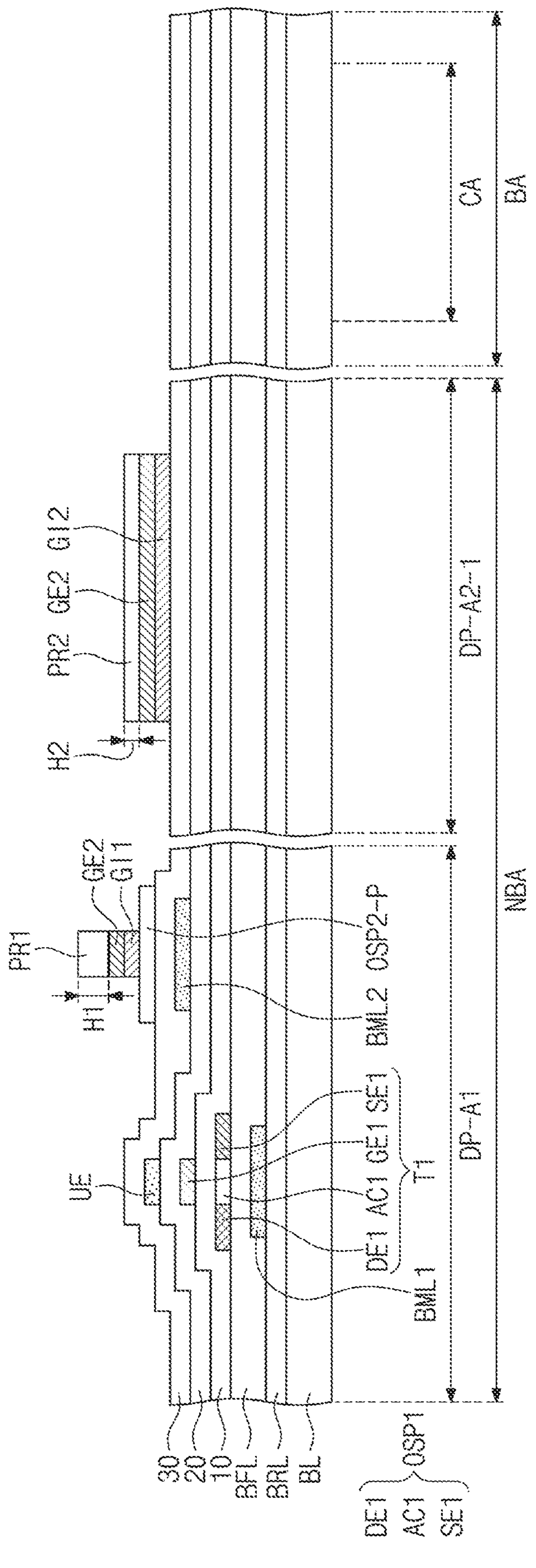

Referring to FIG. 20, the preliminary gate insulating pattern layer GI-P (see FIG. 19) may be etched to form the gate insulating pattern GI1 and the insulating pattern GI2. When the preliminary gate insulating pattern layer GI-P (see FIG. 19) is etched, the preliminary gate insulating pattern layer GI-P (see FIG. 19) not exposed by the first photo-resist layer PR1 may remain as the gate insulating pattern GI1. The gate insulating pattern GI1 may be disposed between the preliminary second semiconductor pattern OSP2-P and the second gate GE2.

When the preliminary gate insulating pattern layer GI-P (see FIG. 19) is etched, the preliminary gate insulating pattern layer GI-P (see FIG. 19) not exposed by the second photo-resist layer PR2 may remain as the insulating pattern GI2. The insulating pattern GI2 may overlap the $(2\text{-}1)^{th}$ area DP-A2-1 and does not overlap the preliminary second semiconductor pattern OSP2-P.

Further, the preliminary second gate layer GE2-P (see FIG. 19) may be etched to form the plurality of second gates GE2. When the preliminary second gate layer GE2-P (see FIG. 19) is etched, the preliminary second gate layer GE2-P (see FIG. 19) not exposed by the first photo-resist layer PR1 may remain as the second gate GE2 overlapping the preliminary second semiconductor pattern OSP2-P.

When the preliminary second gate layer GE2-P (see FIG. 19) is etched, the preliminary second gate layer GE2-P (see FIG. 19) not exposed by the second photo-resist layer PR2 may remain as the second gate GE2 not overlapping the preliminary second semiconductor pattern OSP2-P and overlapping the insulating pattern GI2.

Figure 21:
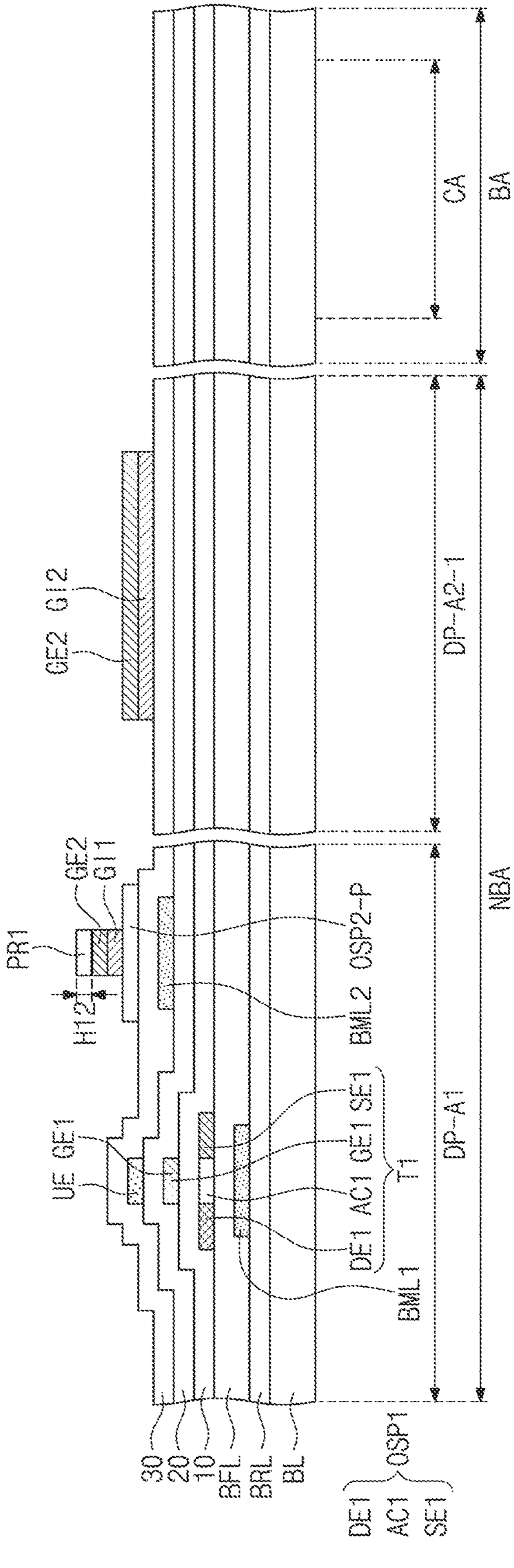

Referring to FIG. 21, upper portions of the second photo-resist layer PR2 (see FIG. 20) and the first photo-resist layer PR1 may be removed. As the second photo-resist layer PR2 is removed, an upper surface of the second gate GE2 overlapping the (2-1)$^{th}$ area DP-A2-1 may be exposed. A thickness H12 of the remaining first photo-resist layer PR1 may be a value obtained by subtracting the second thickness H2 from the first thickness H1 of FIG. 20.

Figure 22:
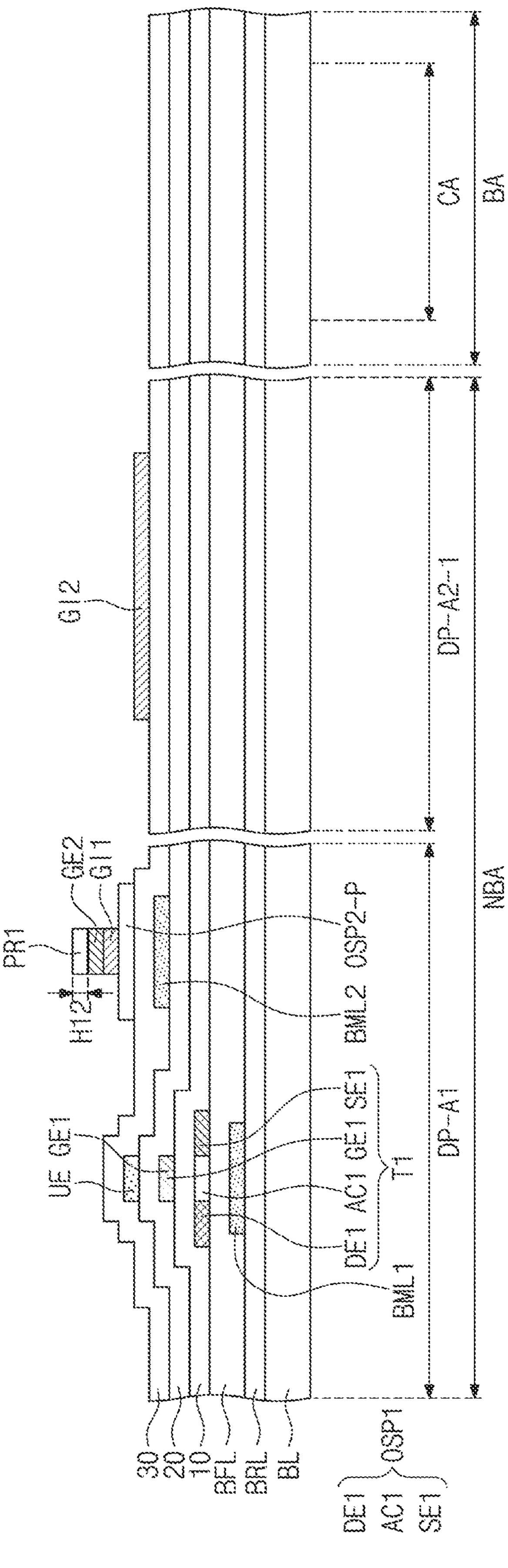

Referring to FIG. 22, the second gate GE2 (see FIG. 21) overlapping the insulating pattern GI2 may be removed. In this process, the second gate GE2 overlapping the gate insulating pattern GI1 may not be removed by the remaining first photo-resist layer PR1.

Figure 23:
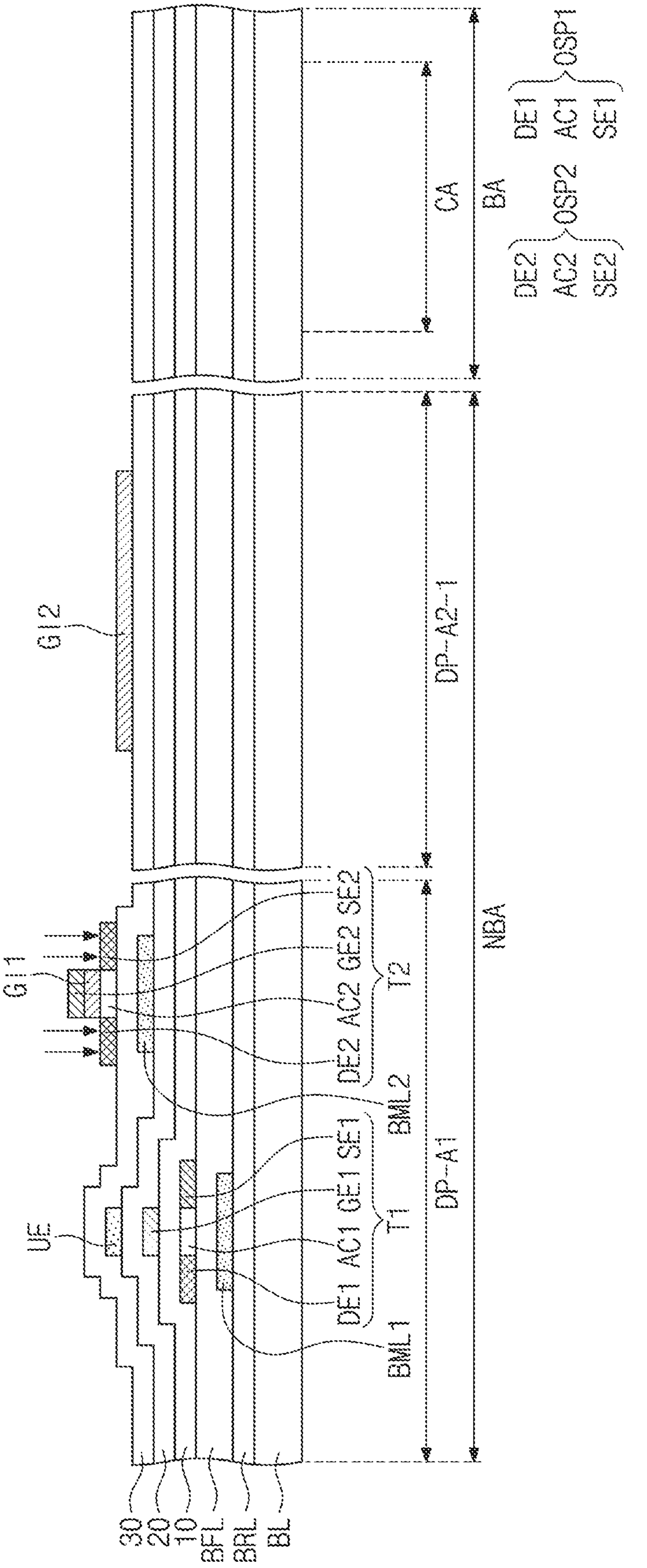

Referring to FIG. 23, the remaining first photo-resist layer PR1 may be removed. Thereafter, the preliminary second semiconductor pattern OSP2-P may be doped using the second gate GE2 as a mask. An area of the preliminary second semiconductor pattern OSP2-P, which overlaps the second gate GE2, may not be doped and become the second active area AC2. An area of the preliminary second semiconductor pattern OSP2-P, which does not overlap the second gate GE2, may be doped and become the second drain area DE2 or the second source area SE2. Accordingly, the second semiconductor pattern OSP2 may be formed. The second transistor T2 may include the second semiconductor pattern OSP2 and the second gate GE2.

Figure 24:
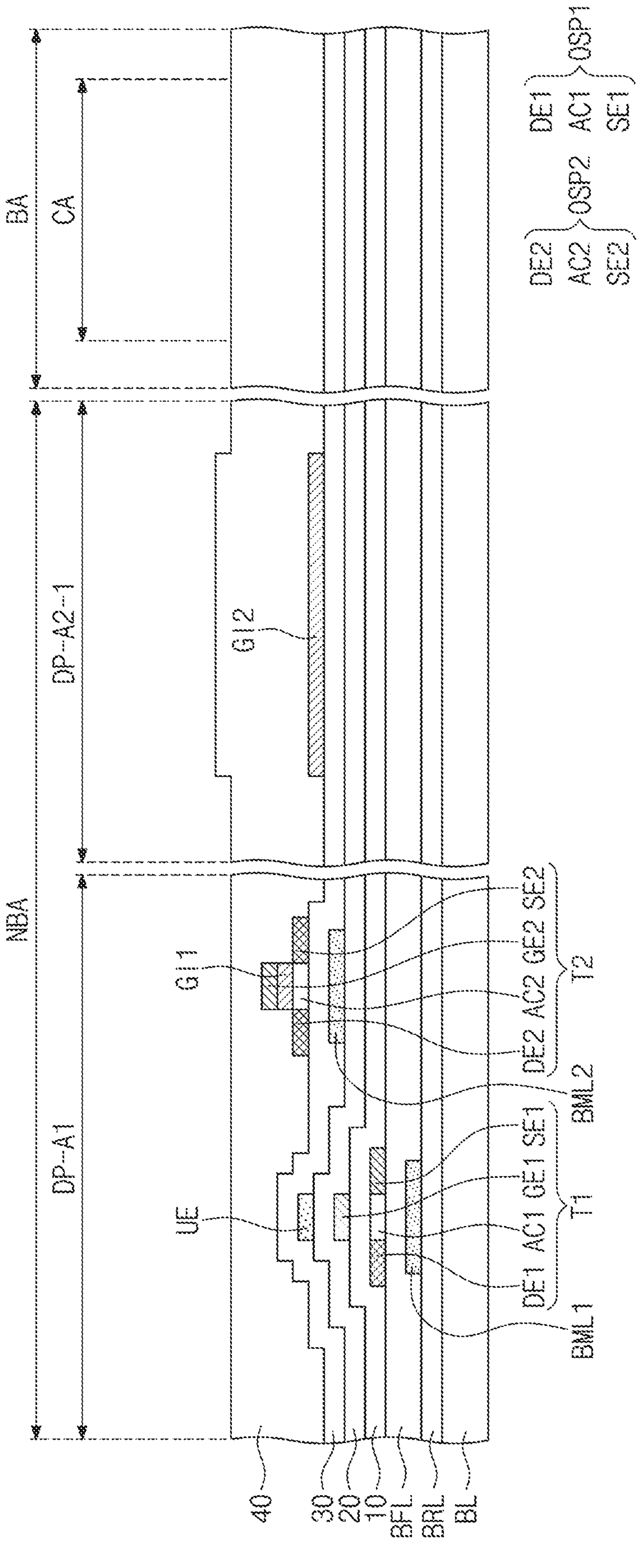

Referring to FIG. 24, the fourth insulating layer 40 may be formed on the third insulating layer 30 overlapping the first area DP-A1, the (2-1)$^{th}$ area DP-A2-1, and the bending area BA. The fourth insulating layer 40 may cover the second semiconductor pattern OSP2, the gate insulating pattern GI1, the second gate GE2, and the insulating pattern GI2. An upper surface of the fourth insulating layer 40, which corresponds to the insulating pattern GI2, may protrude upward by a thickness of the insulating pattern GI2.

Figure 25:
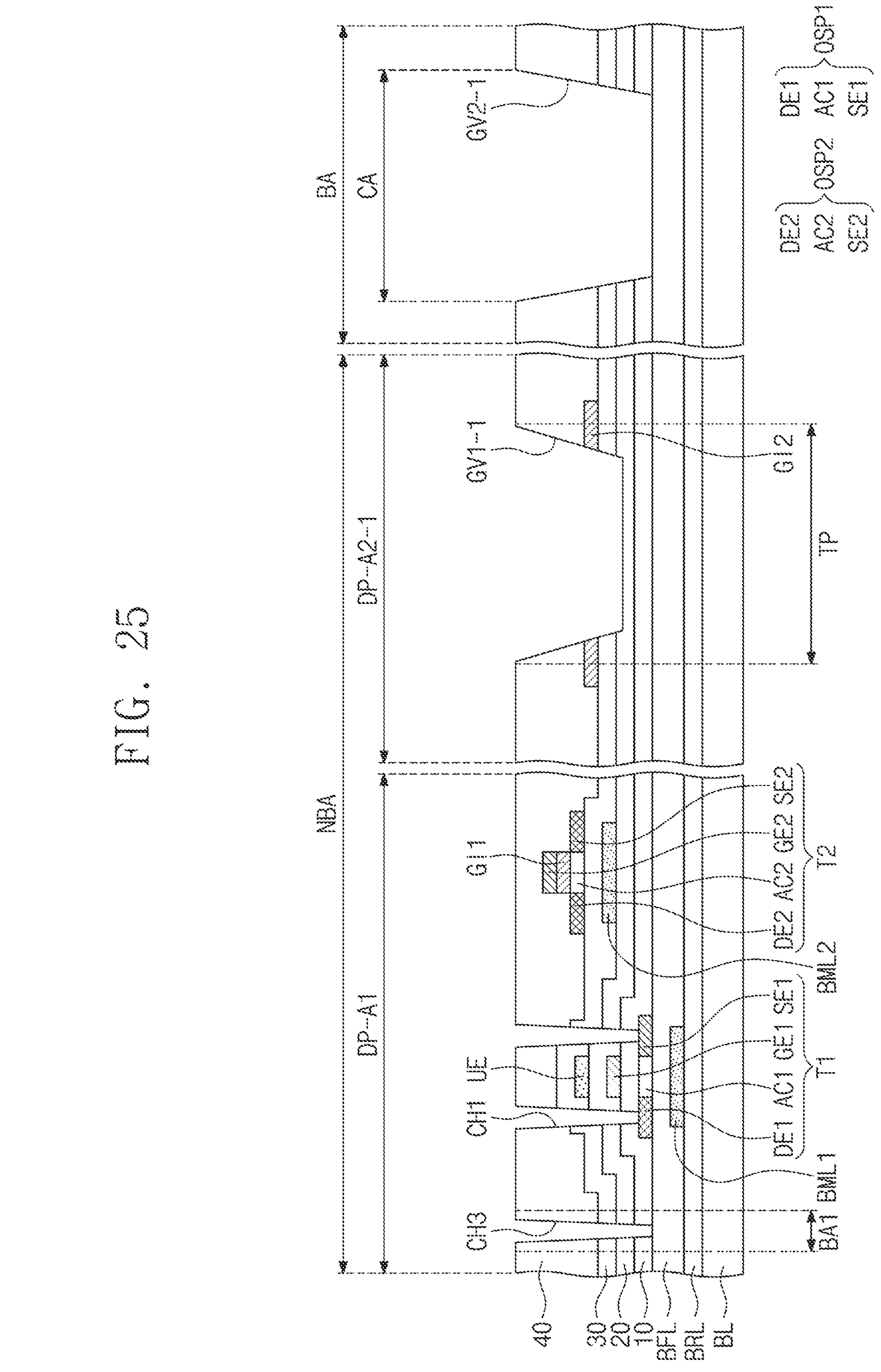

Referring to FIG. 25, some of the plurality of insulating layers 10 to 40 may be etched to form the first through-hole CH1, the third through-hole CH3, the (1-1)$^{th}$ groove GV1-1, and the (2-1)$^{th}$ groove GV2-1 (a first etching operation). Some of the first to fourth insulating layers 10 to 40 may be etched to form the first through-hole CH1 exposing at least one of the first drain area DE1 and the first source area SE1. In a same process, some of the first to fourth insulating layers 10 to 40 may be etched to form the third through-hole CH3 exposing a portion of the upper surface of the buffer layer BFL. The first boundary area VA1 may be an area corresponding to the third through-hole CH3.

In the same process, some of the plurality of insulating layers 20, 30, and 40 overlapping the (2-1)$^{th}$ area DP-A2-1 may be etched to form the (1-1)$^{th}$ groove GV1-1 exposing the second insulating layer 20. In the same process, some of the plurality of insulating layers 10 to 40 overlapping the bending area BA may be etched to form the (2-1)$^{th}$ groove GV2-1 exposing the upper surface of the buffer layer BFL. In an etching process of FIG. 25, the first through-hole CH1, the third through-hole CH3, the (1-1)$^{th}$ groove GV1-1, and the (2-1)$^{th}$ groove GV2-1 may be formed using a mask and an etching gas or using a laser beam.

When the (1-1)$^{th}$ groove GV1-1 is etched, the insulating pattern GI2 as well as the plurality of insulating layers 20 to 40 may be etched together. When the (1-1)$^{th}$ groove GV1-1 is etched, an upper surface of the fourth insulating layer 40 protruding upward by the insulating pattern GI2 may be etched (see FIG. 24). Thus, the (1-1)$^{th}$ groove GV1-1 may be formed at a shallower position than the (2-1)$^{th}$ groove GV2-1 of the bending area BA in which the insulating pattern GI2 is not present. That is, the (2-1)$^{th}$ groove GV2-1 of the bending area BA in which the insulating pattern GI2 is not present exposes the upper surface of the buffer layer BFL, whereas the (1-1)$^{th}$ groove GV1-1 may expose the second insulating layer 20 positioned above the buffer layer BFL.

Figure 26:
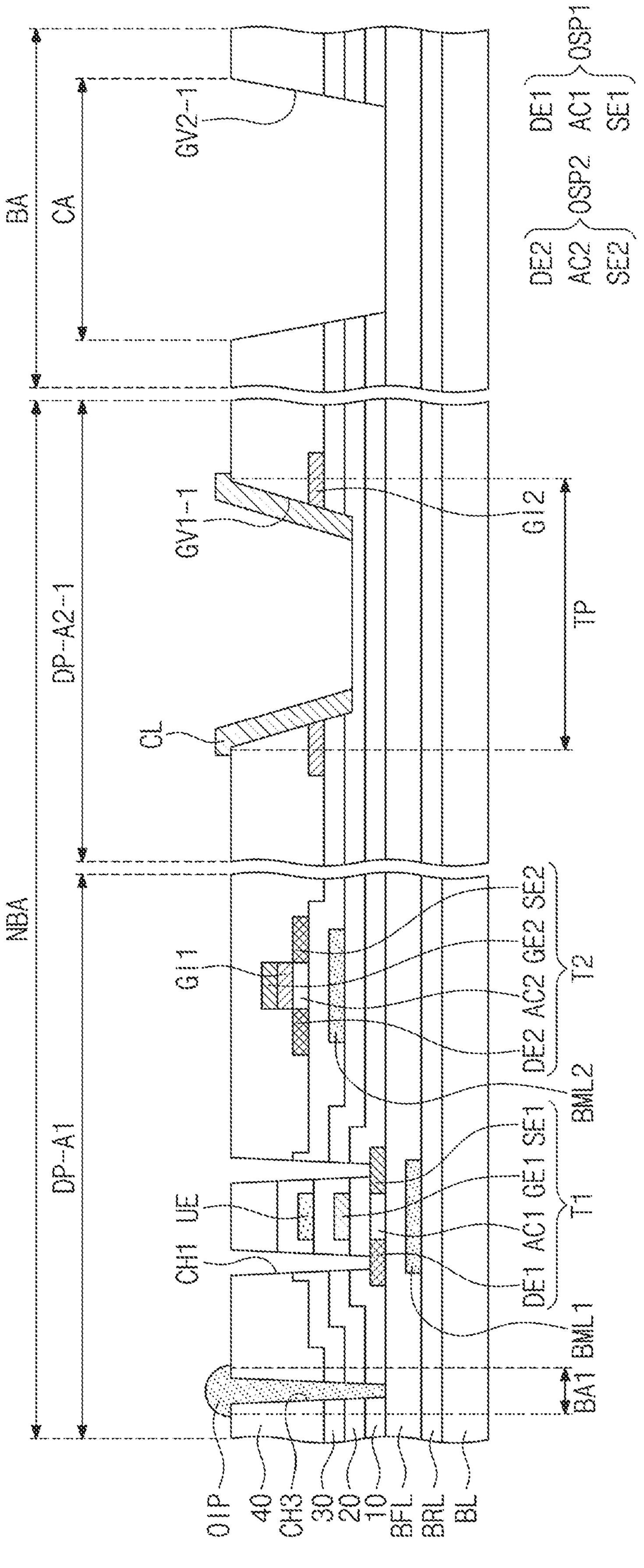

Referring to FIG. 26, the organic pattern OIP filling an inside of the third through-hole CH3 may be formed. In a same process, the groove organic pattern CL that is an organic film covering the inclined surface of the (1-1)$^{th}$ groove GV1-1 may be formed. The organic pattern OIP and the groove organic pattern CL formed in the same process may include a same organic material as each other.

Figure 27:
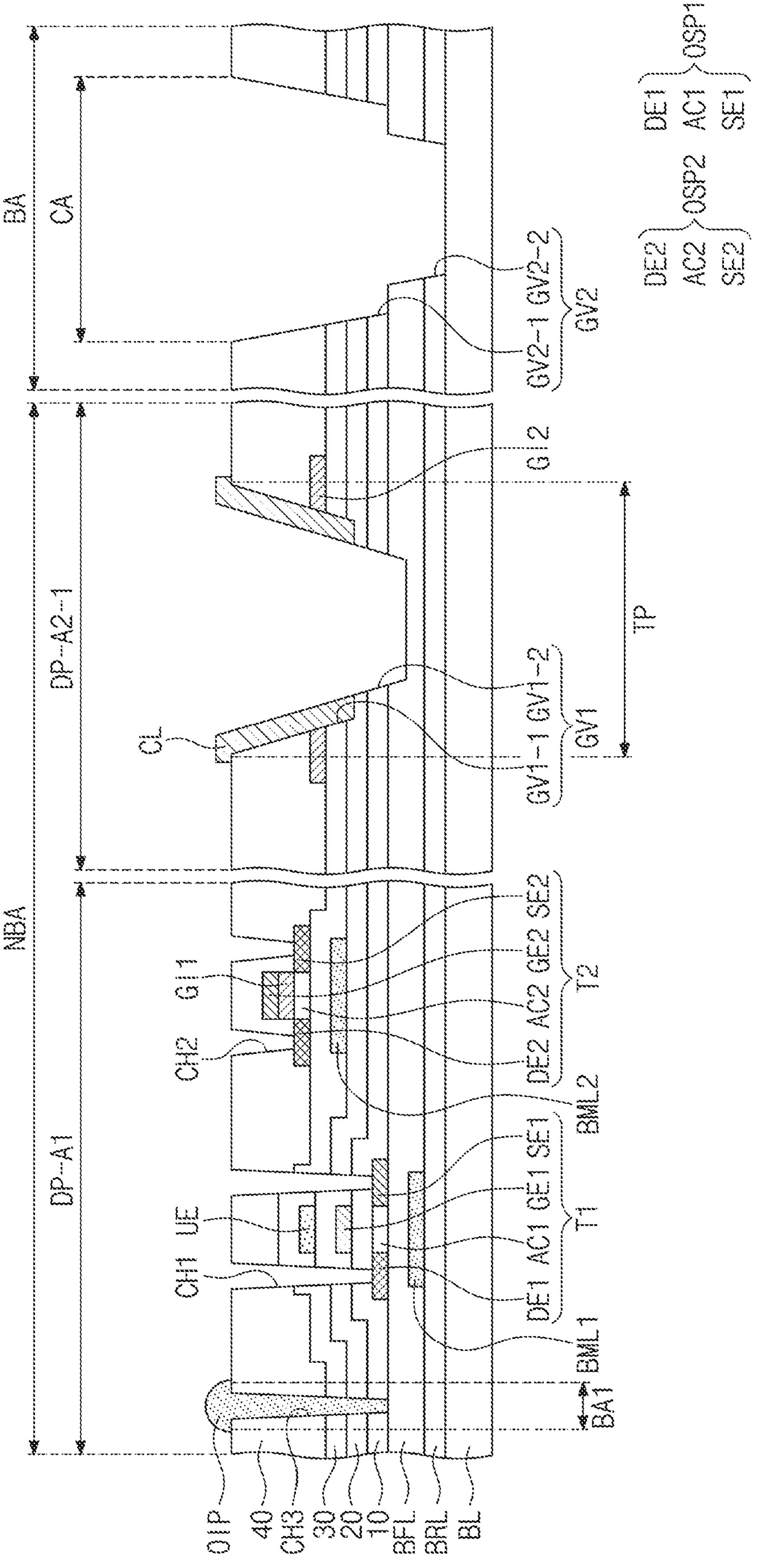

Referring to FIG. 27, some of the plurality of insulating layers 10 to 40 and the inorganic layers BRL and BFL may be etched to form the second through-hole CH2, the (1-2)$^{th}$ groove GV1-2, and the (2-2)$^{th}$ groove GV2-2 (a second etching operation). The fourth insulating layer 40 overlapping the second semiconductor pattern OSP2 ma be etched to form the second through-hole CH2 exposing at least one of the second drain area DE2 and the second source area SE2. In a same process, some of the insulating layers 10 and 20 and some of the inorganic layers BRL and BFL may be etched to form the (1-2)$^{th}$ groove GV1-2 exposing the uppermost inorganic layer among the inorganic layers BRL and BFL.

The (1-2)$^{th}$ groove GV1-2 may extend from the (1-1)$^{th}$ groove GV1-1. The inclined surface of the (1-2)$^{th}$ groove GV1-2 may be stepped with respect to the inclined surface of the (1-1)$^{th}$ groove GV1-1. The inclined surface of the (1-2)$^{th}$ groove GV1-2 may be aligned with the inclined surface of the groove organic pattern CL on cross section.

In the same process, the inorganic layers BRL and BFL may be etched to form the (2-2)$^{th}$ groove GV2-2 exposing the upper surface of the base layer BL. The (2-2)$^{th}$ groove GV2-2 may extend from the (2-1)$^{th}$ groove GV2-1. The inclined surface of the (2-2)$^{th}$ groove GV2-2 may be stepped with respect to the inclined surface of the (2-1)$^{th}$ groove GV2-1.

In an embodiment, as illustrated in FIGS. 25 to 27, the first through-hole CH1, the third through-hole CH3, the (1-1)$^{th}$ groove GV1-1 and the (2-1)$^{th}$ groove GV2-1 may be formed in the first etching operation (see FIG. 25), and the second through-hole CH2, the (1-2)$^{th}$ groove GV1-2, and the (2-2)$^{th}$ groove GV2-2 may be formed in the second etching operation (see FIG. 27). In such an embodiment, corresponding contact holes and grooves are formed in a same process, and thus the number of masks used in the manufacturing process may be reduced. That is, the manufacturing process may be simplified when the corresponding contact holes and grooves are formed in a same process as illustrated in FIGS. 25 to 27 as compared to a conventional method in which the through-holes CH1, CH2, and CH3 of the first area DP-A1, the first groove GV1 of the (2-1)$^{th}$ area DP-A2-1, and the second groove GV2 of the (2-2)$^{th}$ area DP-A2-2 are formed in separate processes.

In such an embodiment, etching is performed in a state in which the insulating pattern GI2 overlaps only the (2-1)$^{th}$ area DP-A2-1, and thus the first groove GV1 of the (2-1)$^{th}$ area DP-A2-1 may be formed at a position shallower than the second groove GV2 of the bending area BA. That is, a position in which the first groove GV1 is formed may be adjusted by the insulating pattern GI2.

Figure 28:
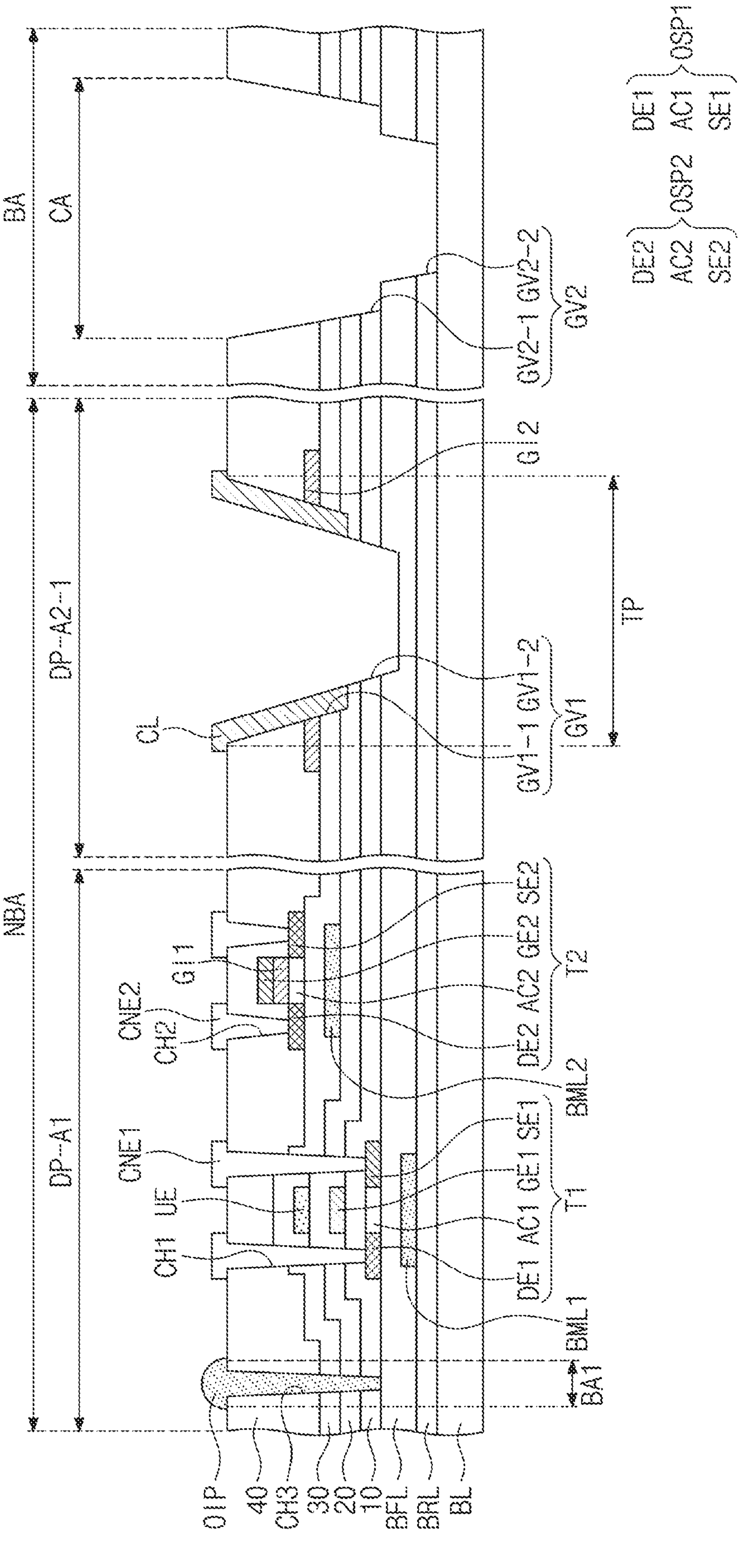

Referring to FIG. 28, the first connection electrode CNE1 and the second connection electrode CNE2 may be formed on the fourth insulating layer 40. The first connection electrode CNE1 may correspond to the first through-hole CH1, and the second connection electrode CNE2 may correspond to the second through-hole CH2. The first and second connection electrodes CNE1 and CNE2 may be formed through a deposition process.

Figure 29:
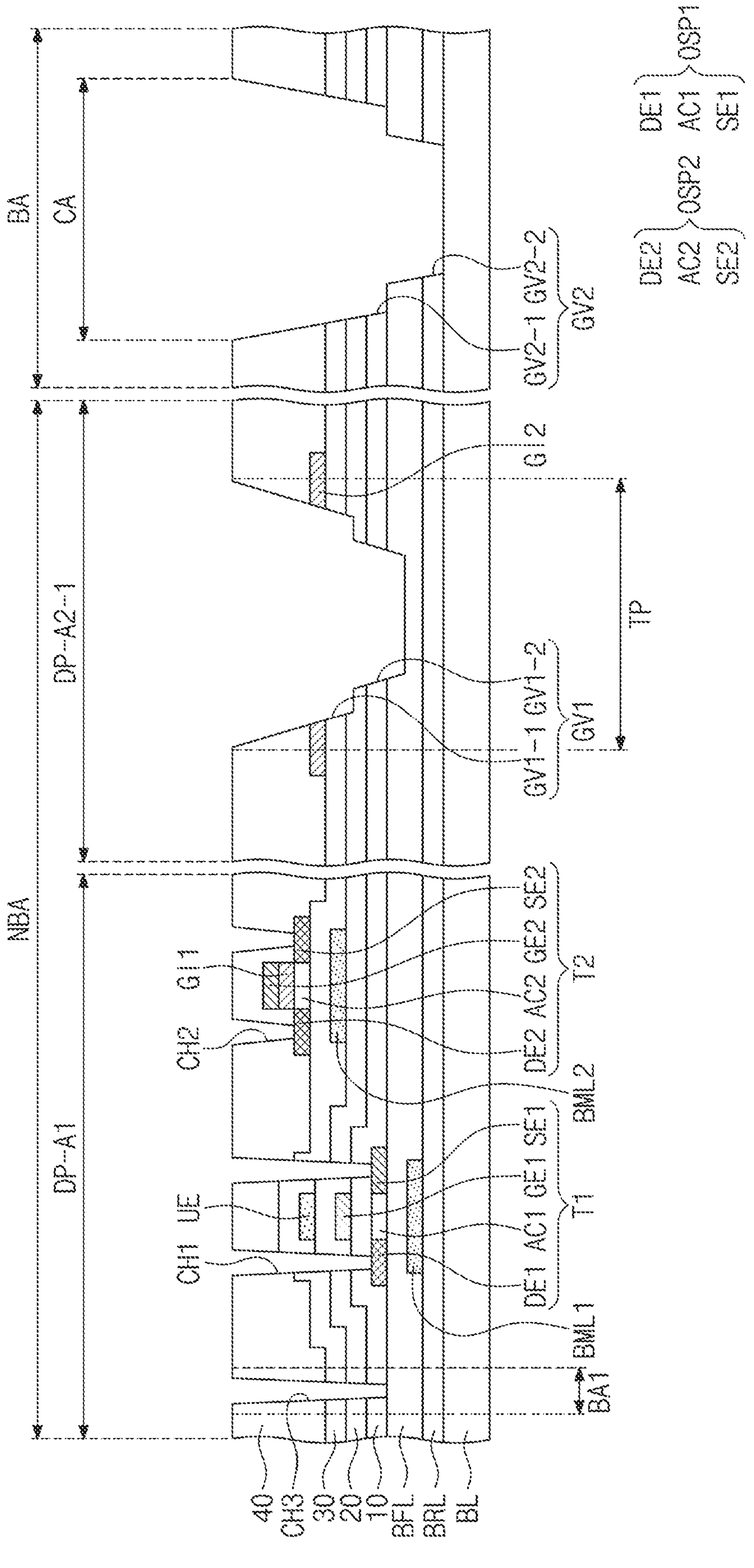
FIGS. 29 to 31 are cross-sectional views illustrating the method of manufacturing a display device according to an alternative embodiment of the present disclosure.
Figure 30:
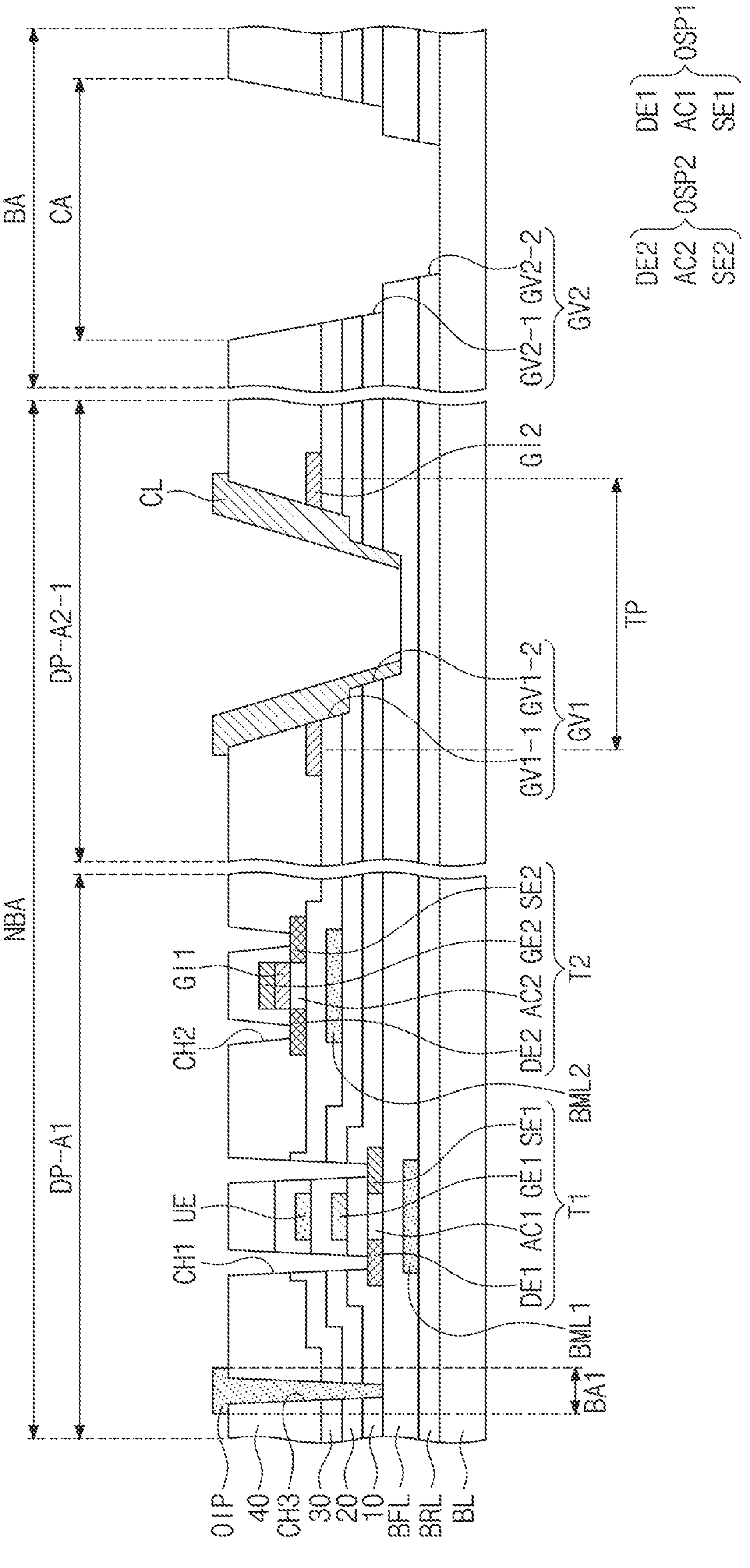
Figure 31:
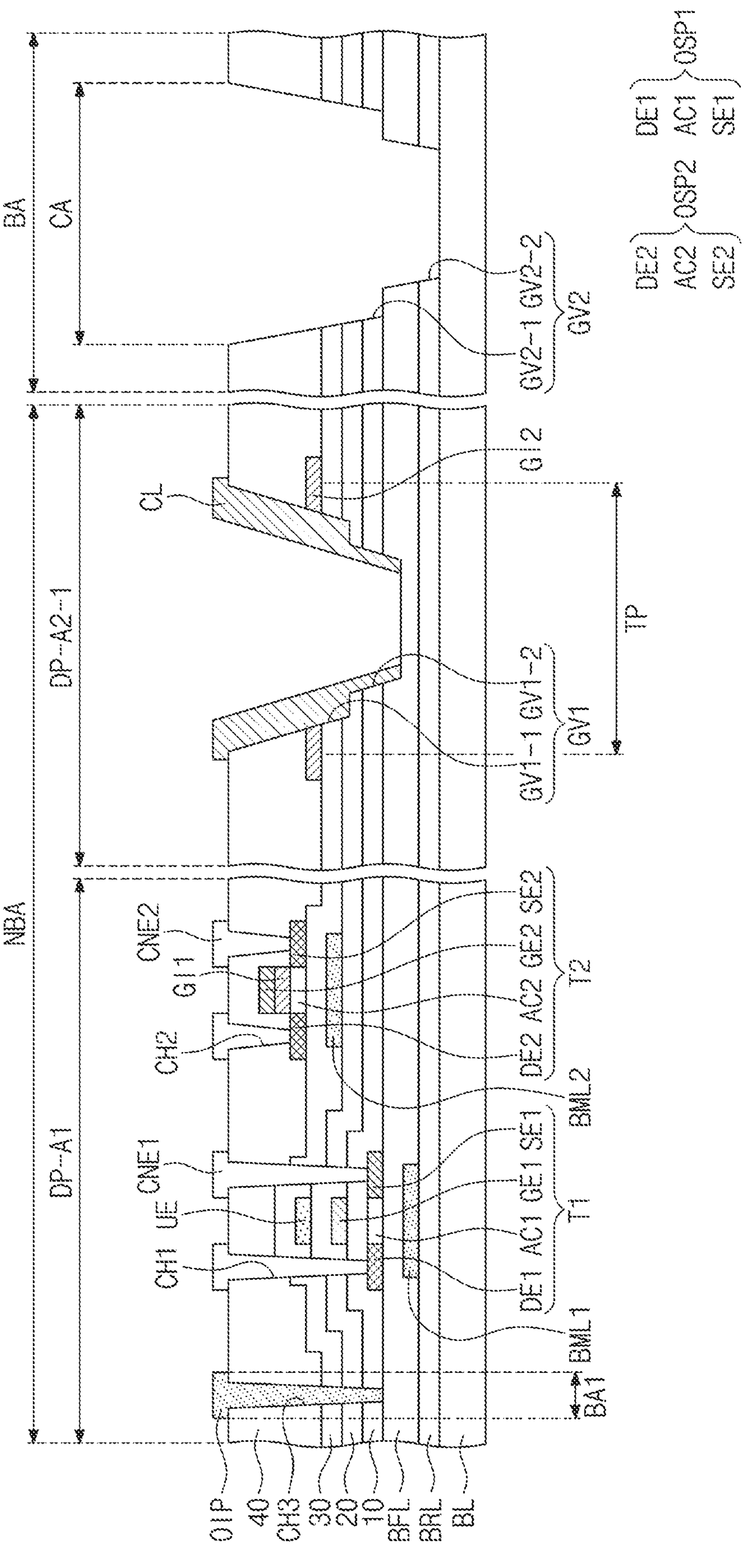

FIGS. 29 to 31 are cross-sectional views illustrating the method of manufacturing the display device DD according to an alternative embodiment of the present disclosure.

In FIGS. 29 to 31, the processes are the same as the manufacturing method of the display device DD described with reference to FIGS. 14 to 28 except for an order of some processes to change the shape of the groove organic pattern CL. Accordingly, any repetitive detailed description of the same configurations and processes of the manufacturing method described above will be omitted or simplified.

Referring to FIG. 29, immediately after the first etching operation (see FIG. 25) of forming the first through-hole CH1, the third through-hole CH3, the $(1\text{-}1)^{th}$ groove GV1-1 and the $(2\text{-}1)^{th}$ groove GV2-1, the second etching operation (see FIG. 27) of forming the second through-hole CH2, the $(1\text{-}2)^{th}$ groove GV1-2 and the $(2\text{-}2)^{th}$ groove GV2-2 may be performed.

Referring to FIG. 30, after all of the first to third through-holes CH1, CH2, and CH3, the first groove GV1, and the second groove GV2 are formed, the organic pattern OIP and the groove organic pattern CL may be formed. The organic pattern OIP may fill the inside of the third through-hole CH3. The groove organic pattern CL may cover the inclined surfaces of the $(1\text{-}1)^{th}$ groove GV1-1 and the $(1\text{-}2)^{th}$ groove GV1-2. The organic pattern OIP and the groove organic pattern CL formed in a same process may include a same organic material as each other.

The groove organic pattern CL is formed after all of the $(1\text{-}1)^{th}$ groove GV1-1 and the $(1\text{-}2)^{th}$ groove GV1-2 are formed. Thus, all of the inclined surfaces of the $(1\text{-}1)^{th}$ groove GV1-1 and the $(1\text{-}2)^{th}$ groove GV1-2 may be covered by the groove organic pattern CL. In such an embodiment, the groove organic pattern CL may have a smooth upper surface as compared to a case in which only the inclined surface of the $(1\text{-}1)^{th}$ groove GV1-1 is covered by the groove organic pattern CL (see FIG. 26). Accordingly, when the connection wire TWL2 (see FIG. 10) is disposed on the groove organic pattern CL, the risk of disconnection may be reduced.

Referring to FIG. 31, the first connection electrode CNE1 and the second connection electrode CNE2 may be formed on the fourth insulating layer 40. The first connection electrode CNE1 may fill an inside of the first through-hole CH1, and the second connection electrode CNE2 may fill an inside of the second through-hole CH2.

In embodiments of the invention, as described above, a first groove is defined by a second area of a display panel, thereby improving transmittance, and a second groove is defined by a third area, thereby facilitating folding. Further, unlike the second groove, a first groove may include an insulating pattern between insulating layers defining the first groove, so that an inorganic layer may remain on a lower surface thereof. The inorganic layer may protect a pixel that is present on the second area.

In such embodiments, the first groove and the second groove are formed simultaneously when a through-hole exposing a transistor is formed, thereby simplifying a manufacturing process.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising a display panel including a display area including a first area and a second area having a higher transmittance than a transmittance of the first area, and a non-display area including a third area which is bendable and adjacent to the display area, wherein the display panel includes:
- a base layer overlapping the display area and the non-display area;
- a pixel disposed on the base layer in the display area;
- an inorganic layer overlapping the display area and the non-display area;
- a plurality of insulating layers arranged on the inorganic layer; and
- an insulating pattern overlapping the second area and disposed between the plurality of insulating layers, wherein the insulating pattern is in a island shape in a plan view, a first groove is defined in the plurality of insulating layers, the insulating pattern, and a portion of the inorganic layer in the second area, and a second groove is defined in the plurality of insulating layers and the inorganic layer in the third area.

2. The display device of claim 1, wherein the first groove exposes the inorganic layer.

3. The display device of claim 1, wherein the second groove exposes an upper surface of the base layer.

4. The display device of claim 1, wherein the plurality of insulating layers entirely overlap the second area, and the insulating pattern overlaps only a portion of the second area.

5. The display device of claim 1, wherein the insulating pattern surrounds the first groove in the plan view.

6. The display device of claim 1, wherein the second area includes:

a transmissive area corresponding to the first groove; and a light emission area adjacent to the transmissive area.

7. The display device of claim 6, wherein the pixel includes:

a light emission element disposed in the first area and the light emission area of the second area; and a transistor disposed in the first area.

8. The display device of claim 7, wherein the light emission element disposed in the light emission area is electrically connected to the transistor disposed in the first area.

9. The display device of claim 1, further comprising:

a groove organic pattern disposed to cover an inner surface of a portion of the plurality of insulating layers defining an upper portion of the first groove and to cover an inner surface of the insulating pattern defining the upper portion of the first groove.

10. The display device of claim 1, further comprising:

a groove organic pattern disposed to cover an inner surface of each of the plurality of insulating layers, the insulating pattern and the portion of the inorganic layer defining the first groove.

11. The display device of claim 7, wherein the transistor includes a first transistor and a second transistor, the first transistor includes:

a first semiconductor pattern including a first drain area, a first active area, and a first source area; and a first gate overlapping the first active area, and the second transistor includes:

a second semiconductor pattern including a second drain area, a second active area, and a second source area;

a second gate overlapping the second active area; and a gate insulating pattern disposed between the second active area and the second gate.

12. The display device of claim 11, wherein the gate insulating pattern includes a same material as a material of the insulating pattern.

13. An electronic device comprising:

a display panel including a display area including a first area and a second area having a higher transmittance than a transmittance of the first area, and a non-display area including a third area which is bendable and adjacent to the display area, wherein the display panel includes:

a base layer overlapping the display area and the non-display area;

a pixel disposed on the base layer in the display area;

an inorganic layer overlapping the display area and the non-display area;

a plurality of insulating layers arranged on the inorganic layer; and an insulating pattern overlapping the second area and disposed between the plurality of insulating layers, wherein the insulating pattern has an island shape in a plan view, wherein a first groove is defined in the plurality of insulating layers, the insulating pattern, and a portion of the inorganic layer in the second area, and wherein a second groove is defined in the plurality of insulating layers and the inorganic layer in the third area.

* * * * *